US010276247B2

(12) United States Patent
Alhussien et al.

(10) Patent No.: US 10,276,247 B2
(45) Date of Patent: Apr. 30, 2019

(54) READ RETRY OPERATIONS WITH ESTIMATION OF WRITTEN DATA BASED ON SYNDROME WEIGHTS

(71) Applicant: Seagate Technology LLC, Cupertino, CA (US)

(72) Inventors: AbdelHakim S. Alhussien, San Jose, CA (US); Sundararajan Sankaranarayanan, Fremont, CA (US); Thuy Van Nguyen, Hanoi (VN); Ludovic Danjean, San Jose, CA (US); Erich F. Haratsch, San Jose, CA (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/205,654

(22) Filed: Jul. 8, 2016

(65) Prior Publication Data
US 2017/0125114 A1  May 4, 2017

Related U.S. Application Data

(63) Continuation-in-part of application No. 14/928,284, filed on Oct. 30, 2015.

(51) Int. Cl.
*G11C 16/28* (2006.01)
*G11C 29/52* (2006.01)
(Continued)

(52) U.S. Cl.
CPC ......... *G11C 16/28* (2013.01); *G06F 11/1012* (2013.01); *G11C 11/5642* (2013.01);
(Continued)

(58) Field of Classification Search
CPC ............... G11C 11/5642; G11C 16/26; G11C 29/50004; G11C 29/52; G11C 16/349;
(Continued)

(56) References Cited

U.S. PATENT DOCUMENTS 6,466,614 B1   10/2002   Smith
8,243,511 B2   8/2012    KatzPatapoutian et al.
(Continued)

OTHER PUBLICATIONS

Alhussien et al., "Read Retry Operations Where Likelihood Value Assignments Change Sign at Different Read Voltages for each Read Retry," U.S. Appl. No. 15/041,501, filed Feb. 11, 2016.
(Continued)

*Primary Examiner* — Kyle Vallecillo
(74) *Attorney, Agent, or Firm* — Ryan, Mason & Lewis, LLP

(57) ABSTRACT

Methods and apparatus are provided for read retry operations that estimate written data based on syndrome weights. One method comprises reading a codeword from a memory multiple times using multiple read reference voltages; obtaining a syndrome weight for each of the readings of the codeword; identifying a given reading of the codeword having a substantially minimum syndrome weight; and estimating a written value of the codeword based on the given reading. Two cell voltage probability distributions of cell voltages are optionally calculated for each possible cell state of the memory, based on the estimated written value and plurality of readings of the codeword. The cell voltage probability distributions are used to (i) dynamically select log likelihood ratio values for a failing page, (ii) determine a read reference voltage that gives a desired log likelihood ratio value, or (iii) dynamically select log likelihood ratio values for the page populations associated with the distributions.

20 Claims, 11 Drawing Sheets

(51) Int. Cl.
  *G06F 11/10* (2006.01)
  *G11C 11/56* (2006.01)
  *H03M 13/11* (2006.01)
  *H03M 13/37* (2006.01)
  *H03M 13/00* (2006.01)

(52) U.S. Cl.
  CPC .... *H03M 13/1108* (2013.01); *H03M 13/1111* (2013.01); *H03M 13/3707* (2013.01); *H03M 13/3723* (2013.01); *H03M 13/612* (2013.01); *H03M 13/6325* (2013.01)

(58) Field of Classification Search
  CPC .... G11C 2029/0411; G11C 2029/5004; G11C 29/021; G11C 29/028; G11C 7/14; G06F 11/1044; G06F 11/1048
  See application file for complete search history.

(56) References Cited

U.S. PATENT DOCUMENTS

| | | | |
|---|---|---|---|
| 8,392,809 | B1 | 3/2013 | Varnica et al. |
| 8,607,124 | B2 | 12/2013 | Weingarten |
| 8,769,380 | B1 | 7/2014 | Burd |
| 9,037,946 | B2 | 5/2015 | Jeon et al. |
| 9,043,678 | B2 | 5/2015 | Jeon et al. |
| 9,059,738 | B2 | 6/2015 | Chung et al. |
| 9,209,835 | B2 | 12/2015 | Alhussien et al. |
| 9,236,099 | B2 | 1/2016 | Alhussien et al. |
| 9,263,138 | B1 | 2/2016 | Wilson et al. |
| 9,378,765 | B2 | 6/2016 | Cai |
| 9,396,792 | B2 | 7/2016 | Wu et al. |
| 9,697,905 | B2 | 7/2017 | Sharon et al. |
| 9,728,263 | B2 | 8/2017 | Sharon et al. |
| 9,768,807 | B2 | 9/2017 | Zhang |
| 2011/0161775 | A1 | 6/2011 | Weingarten |
| 2011/0182119 | A1 | 7/2011 | Strasser et al. |
| 2012/0317460 | A1 | 12/2012 | Chilappagari et al. |
| 2013/0139035 | A1 | 5/2013 | Zhong et al. |
| 2013/0173985 | A1 | 7/2013 | Chung et al. |
| 2013/0343131 | A1 | 12/2013 | Wu et al. |
| 2014/0229131 | A1 | 8/2014 | Cohen et al. |
| 2014/0269052 | A1 | 9/2014 | Dusija et al. |
| 2014/0281750 | A1 | 9/2014 | Jeon et al. |
| 2014/0281772 | A1 | 9/2014 | Jeon et al. |
| 2014/0355340 | A1 | 12/2014 | Sharon et al. |
| 2015/0039842 | A1 | 2/2015 | Fitzpatrick et al. |
| 2015/0052387 | A1 | 2/2015 | Kern et al. |
| 2015/0085571 | A1 | 3/2015 | Hu et al. |
| 2015/0085573 | A1 | 3/2015 | Sharon et al. |
| 2015/0127883 | A1 | 5/2015 | Chen et al. |
| 2015/0149840 | A1 | 5/2015 | Alhussien et al. |
| 2015/0149855 | A1 | 5/2015 | Alhuissien et al. |
| 2015/0149871 | A1 | 5/2015 | Chen et al. |
| 2015/0162057 | A1 | 6/2015 | Alhussien et al. |
| 2015/0243363 | A1 | 8/2015 | Wu et al. |
| 2015/0256201 | A1* | 9/2015 | Sakurada ........... H03M 13/1111 714/719 |
| 2015/0287453 | A1 | 10/2015 | Wu et al. |
| 2015/0293813 | A1* | 10/2015 | Lin ................. G06F 11/1012 714/764 |
| 2016/0247576 | A1 | 8/2016 | Park |
| 2017/0068591 | A1 | 3/2017 | Tate et al. |
| 2017/0148510 | A1* | 5/2017 | Bazarsky ........... G11C 11/5642 |
| 2017/0271031 | A1 | 9/2017 | Sharon et al. |

OTHER PUBLICATIONS

Peleato et al., "Towards Minimizing Read Time for Nand Flash".

* cited by examiner

| READ | LLR 0 | LLR 1 | LLR 2 | LLR 3 | LLR 4 | LLR 5 | LLR 6 | LLR 7 |
|---|---|---|---|---|---|---|---|---|
| 1 | 3 | 5 | | | | | | |
| 2 | 5 | −3 | 6 | | | | | |
| 3 | 5 | 3 | 1 | −6 | | | | |
| 4 | 5 | 4 | 2 | −3 | −6 | | | |
| 5 | 6 | 2 | −1 | −3 | −5 | −7 | | |
| 6 | 7 | 6 | 5 | 3 | 1 | −2 | −6 | |
| 7 | 7 | 5 | 3 | 1 | −1 | −3 | −5 | −7 |

LSB

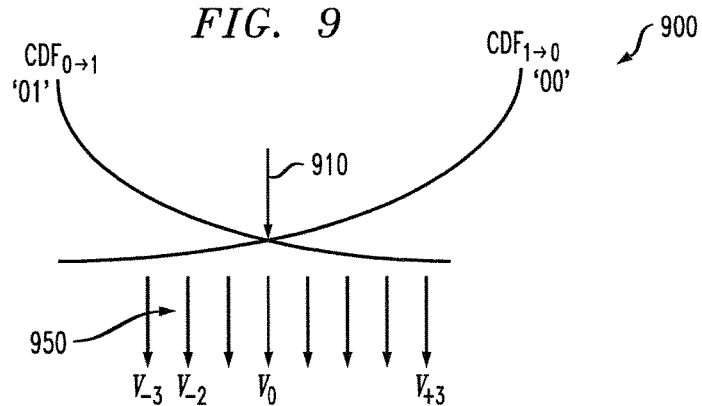
FIG. 9
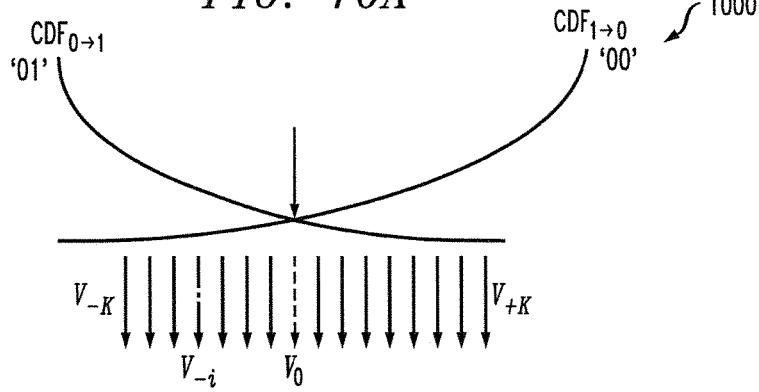
FIG. 10A
FIG. 10B
```
For (i=0; i>-K; i--)
X = LOG(CDF_{0→1}(V_{-i}) - CDF_{0→1}(V_0)) - LOG(CDF_{1→0}(V_{-i}) - CDF_{1→0}(V_0))
if ⌊X⌋ == α? Δ = V_0 - V_{-i}; break
```

READ RETRY OPERATIONS WITH ESTIMATION OF WRITTEN DATA BASED ON SYNDROME WEIGHTS

CROSS-REFERENCE TO RELATED APPLICATIONS

The present application is a continuation-in-part of U.S. patent application Ser. No. 14/928,284, filed Oct. 30, 2015, now U.S. Pat. No. 9,818,488, entitled "Read Threshold Voltage Adaptation Using Bit Error Rates Based On Decoded Data," and is related to U.S. patent application Ser. No. 15/041,501, filed Feb. 11, 2016, now U.S. Pat. No. 9,633,740, entitled "Read Retry Operations Where Likelihood Value Assignments Change Sign At Different Read Voltages For Each Read Retry;" U.S. patent application Ser. No. 14/135,837, filed Dec. 20, 2013, now U.S. Pat. No. 9,209,835, entitled "Read Retry For Non-Volatile Memories;" and U.S. patent application Ser. No. 14/136,283, filed Dec. 20, 2013, now U.S. Pat. No. 9,236,099, entitled "Multiple Retry Reads in a Read Channel of a Memory," each incorporated by reference herein in its entirety.

FIELD

The field relates generally to solid state storage media and more particularly to adjustments of read threshold voltages for such solid state storage media.

BACKGROUND

Solid state storage devices use analog memory cells to store data. Each memory cell stores a storage value, such as an electrical voltage. The storage value represents the information stored in the memory cell. Many solid state storage devices distinguish between different binary values that a memory cell may store based on a read voltage level of the memory cell. The range of possible storage values for each memory cell is typically divided into threshold regions, with each region separated by a read threshold voltage and corresponding to one or more data bit values. Ideally, all of the memory cells in a given solid state storage device have identical read threshold voltages for the logical bit values stored. In practice, however, the read threshold voltages differ across the cells in probability distributions along the read threshold voltage axis (e.g., "read threshold voltage distributions") that are similar to a Gaussian distribution.

In addition, solid state storage devices can shift over time. For example, memory cell leakage, memory cell damage and other disturbances to memory cells can alter the read voltage levels of the memory cells. Thus, the read threshold voltages can shift over time. The rate of leakage and other disturbances can also increase with age as memory cells are used over time. If the read voltage level of a memory cell shifts past a read threshold voltage, a data error occurs, as the value of the data read from the memory cell is different than the value of the data that was written to the memory cell.

Data is read from a non-volatile memory in blocks referred to herein as a "read unit" or as a "codeword" that is typically protected from error by included error correction, such as included parity bits generated using an error correction algorithm, such as low density parity check (LDPC) encoding. Bits are read from non-volatile memory cells and the resulting data is decoded to apply the error correction algorithm, for example, in an LDPC decoder. If the data fails to converge in the LDPC decoder, a read retry operation can be used to re-read the data and to again apply the error correction algorithm. Although cell voltage is continuous, non-volatile memory cells generally provide only binary hard decisions after a read operation. When soft iterative decoding algorithms, such as LDPC decoding algorithms, are used for error correction, it is desirable to convert the hard decisions generated by the non-volatile memory into soft decisions that give the decoder more information to help correct errors. The soft decisions converted from a single read may not be of sufficient quality for successful decoding. In this case, multiple reads with varying read voltages can be used to obtain sufficient quality of the soft decisions. Thus, the location and frequency of the read reference voltages can directly affect the quality of the soft decision and eventually, the theoretic information content of the channel reads.

A need remains for improved techniques for performing read retry operations.

SUMMARY

Illustrative embodiments of the present invention provide methods and apparatus for read retry operations that estimate written data based on syndrome weights. In one embodiment, a method comprises reading at least one codeword from a memory a plurality of times using a plurality of read reference voltages; obtaining a syndrome weight for each of the readings of the at least one codeword; identifying a given one of the readings of the at least one codeword having a substantially minimum syndrome weight; and estimating a written value of the at least one codeword based on the given one of the readings.

In at least one embodiment, at least two cell voltage probability distributions (e.g., cumulative distribution functions and/or derived probability distributions) of cell voltages are calculated for each possible cell state of the memory, based on the estimated written value and plurality of reads of the at least one codeword.

In one or more embodiments, the at least two cell voltage probability distributions are used to (i) dynamically select log likelihood ratio values for a failing page, or (ii) determine a read reference voltage that gives a desired log likelihood ratio value. In a further variation, the at least two cell voltage probability distributions are obtained for a plurality of page populations and are processed to dynamically select log likelihood ratio values for the plurality of page populations.

The disclosed techniques for read retry operations overcome one or more of the problems associated with the conventional techniques described previously. These and other features and advantages of the present invention will become more readily apparent from the accompanying drawings and the following detailed description.

BRIEF DESCRIPTION OF THE DRAWINGS

FIGS. 9 and 10A illustrate two example cumulative distribution functions associated with two written states;

FIG. 10B illustrates one implementation of pseudo code for a search technique to find a substantially optimal read reference voltage, $V_{REF}$, from the cumulative distribution functions of FIG. 10A when one or more desired log likelihood ratios are known, according to one embodiment of the invention;

DETAILED DESCRIPTION

Figure 1:
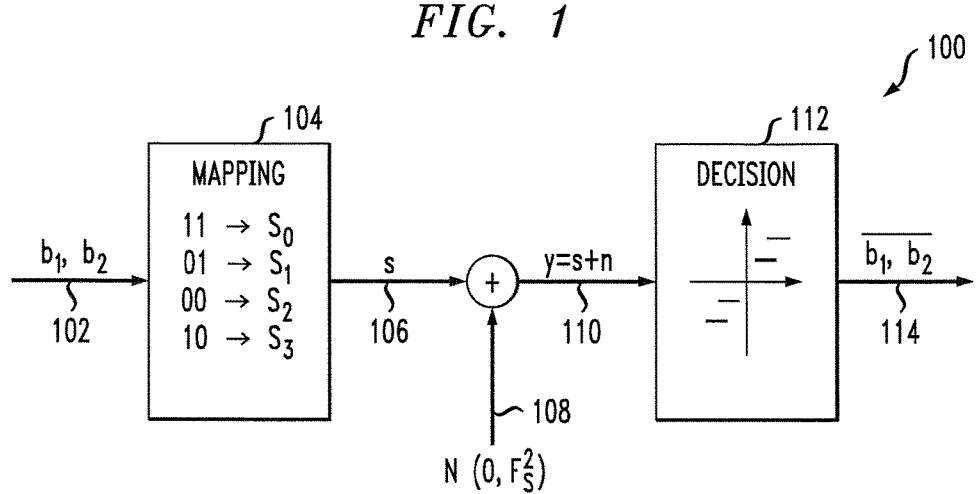
FIG. 1 illustrates a model of a non-volatile memory channel in which channel tracking can be used to adjust read retry reference voltages in accordance with one or more embodiments of the present invention.

One or more embodiments of the present invention are related to improved techniques for read retry operations. As discussed hereinafter, channel tracking includes estimating means and variances of the voltage distributions for the different data states in the non-volatile memory. If low density parity check decoding, for example, of retrieved data fails, then, in one or more embodiments, the memory controller enters into a soft low density parity check decoding operation, in which soft data is used as an input to the low density parity check decoder. In a read retry mode, multiple reads of a memory page are performed at different read reference voltages to obtain a quantized version of the stored voltage on the cell. Thereafter, the multiple read patterns for each bit are mapped to a log likelihood ratio (LLR) that represents the confidence level of the bit value being a binary zero or one. Finally, the log likelihood ratios are passed as the soft data input to the low density parity check decoder to recover the written data. Because log likelihood ratios are represented by a limited number of bits, such as but not limited to, four bit signed integers, the possible number of log likelihood ratio values will be very limited (16 in the case of four bit signed integers). In the log likelihood ratios, the sign indicates the decision region (e.g., negative for a binary zero value and positive for a binary one value), and the magnitude indicates the confidence in the decision.

The resolution of the read voltage step is adjusted to effectively use the limited bit-width of the log likelihood ratios. In some embodiments, the multiple read patterns for each bit are mapped to log likelihood ratios using a look-up table designed to increase the probability of convergence of the low density parity check decoder at early read retries. On average, this improves the system throughput. This ensures that multi-bit patterns are mapped to proper fixed point log likelihood ratio values compared to the less robust computation of log likelihood ratios based on uniformly spaced read reference voltages. Notably, although some embodiments use log likelihood ratios, plain likelihood probability values can also be used.

One or more embodiments of the invention implement read retry operations when channel estimation is required to track different channels in a memory that arise from noise variations of the read locations in the memory media. Multiple channels also need to be tracked if other variations exist in various properties across the storage media that are not captured by the geometry, including, but not limited to:

1. number of reads variations between pages that are not tracked separately;

2. retention regions in the same block that are not tracked separately; and 3. lesser quality pages in the same block that are not tracked separately from pages with average noise degradation.

If an optimal read reference voltage, $V_{REF}$, cannot be tracked at a small enough media geometric granularity, or, the source of the read location cannot be verified or correlated with a known optimum read reference voltage, $VR_{REF}$, then a ranked list of most likely substantially optimal read reference voltages, $V_{REF}$, allows multiple read retry operations to be performed using the ranked list. As discussed further below, in one or more embodiments, the ranked list is ranked in an order that substantially minimizes the amount of time need to decode the data.

In one or more embodiments, read retry operations can use a read reference voltage, $V_{REF}$, from the ranked list at different stages of a read retry operation based on a ranking of the various available read reference voltage, $V_{REF}$, on the list. In this manner, the available read reference voltages, $V_{REF}$, are ranked for each population, and the ranked list for a given population is employed when a page of the population is read in a read retry mode. As used herein, a page population comprises a plurality of pages that share substantially identical channel models. Similarity in channel condition can be assumed, for example, for pages written and erased at the same time, read the same number of times, or exposed to the same temperature condition by virtue of co-location on the die. Similarity in geometry can be based, for example, on belonging to the same region of the die or block that exhibits similar error behavior due to similar inter-cell inference (ICI) or physical properties on the underlying memory cells. In general, a page population includes those pages that are known a priori to have the same bit error rate and $V_{REF}$ shift. The granularity of a given page population may comprise, for example, pages in a block with different voltage statistics behavior, or pages coming from multiple dies.

In another variation, populations are classified based on the bit error rate (or disparity or syndrome weight) at a default $V_{REF}$. All pages that have same the bit error rate (for example) at the default $V_{REF}$ form a population and tracking is run on the average statistics of that population. Then, the read reference voltages, $V_{REF}$, coming from all the populations are ranked based on the size of those populations (or the bit error rate at the default $V_{REF}$ for each population, or the relative improvement in bit error rate between default and optimal $V_{REF}$ for that population).

While conventional approaches aim to determine average variations for multiple dies or multiple pages, one or more aspects of the present invention perform per-population channel tracking to account for variations among each page population.

There are a number of issues that make accurate channel estimation difficult, as discussed further below in a section entitled "Channel Estimation/Tracking." In at least one embodiment, calibration-assisted read retry optimization techniques are provided that are substantially immune to channel variations. Such calibration techniques will provide a ranked list of substantially optimal parameters that cover different channel conditions and manufacturing processes. The ranked list of substantially optimal parameters is used in the read retry of failed pages to improve reliability and decrease the time needed to decode data.

In at least one embodiment, discussed further below in conjunction with FIGS. 7 and 8, channel estimation is improved by employing a ranked list of substantially optimal channel parameters for both average pages and the worst outlier pages. As discussed further below in a section entitled "Channel Estimation/Tracking," in one or more embodiments, channel estimation provides a ranked list of substantially optimal read reference voltages, $V_{REF}$, based on a predefined channel metric, such as bit error rate, disparity, a substantially minimal syndrome weight and measures of one or more of average system latency and tail latency, each discussed further below. The Channel Estimation/Tracking can generate, for example, a list of read reference voltages, $V_{REF}$, and their corresponding frequencies in given page populations, sorted based on bit error rate. The ranked list of read reference voltages, $V_{REF}$, can be, for example, a list of single values for a single level cell (SLC), or a least significant bit, or a list of paired values as in a multi-level cell (MLC), or a tri-level cell (TLC).

The read reference voltages, $V_{REF}$, can be expressed, for example, as voltage values or as an offset or adjustment to a default voltage level.

A substantially optimal read reference voltage, $V_{REF}$, specifies a reference voltage to read the page so as to reduce, for example, the bit error rate. One or more embodiments provide different read reference voltages, $V_{REF}$, for different page populations that originate from non-identical channel models. Then, read retry operations can use a read reference voltage, $V_{REF}$, from the ranked list at different stages of a read retry operation based on a ranking of the various read reference voltage, $V_{REF}$, on the list. As discussed further below, the ranking can be based on, for example, a size of different populations, or how much a shift in a particular read reference voltage, $V_{REF}$, improves the bit error rate. In this manner, the available read reference voltages, $V_{REF}$, are ranked for each population, and the ranked list for a given population is employed when a page of the population is read in a read retry mode.

Another embodiment, discussed further below in conjunction with FIGS. 9 through 14, dynamically estimates channel parameters, for example, on the fly or in real-time, for a failing page. In one or more embodiments, channel and retry parameters are calculated on the fly based on a channel tailored to the failing page. In this manner, the read retry scheme is tailored to a failing page by calculating the read retry settings and channel parameters on the fly based on reads of the failing page. Since the original data for a failing page cannot be obtained, as the decoder cannot converge, tailored channel parameters are calculated based on the count of unsatisfied parity checks (syndrome weight). It has been found that the unsatisfied parity check count strongly correlates with the bit error rate of the page being read for low density parity codes (LDPC). Multiple read retry operations are performed of the failing page or code words and a probability density function (PDF) is generated of the cell voltage derived from the syndrome weight profile of the multiple reads. Once the syndrome weight profile is obtained, then the substantially optimal read reference voltage of the failing page can be found. In addition, the PDF can be fit to a certain underlying distribution to calculate the first order moments and second order moments of the distribution. Obtaining the moments of the cell voltage PDF can be useful to obtain the log-likelihood ratios decisions based on multiple reads to enable soft decision decoding of LDPC, as discussed further below.

If the decoder can obtain the genie data (e.g., the data that was written), a true profile of the directed bit error rate (BER) can be found to compute log likelihood ratios (LLRs) of decision regions. If the decoder cannot decode the true data, however, then the codeword with a minimum syndrome weight can be used to compute an approximate directed BER profile in order to compute BER.

A syndrome or result vector is calculated, for example, in the decoder, identifying variable nodes with unsatisfied parity checks. If the syndrome is a zero-valued vector, the codeword is correct and is provided as a hard decision output from the decoder. If the syndrome contains non-zero vector elements, the data failed to converge and decoding was unsuccessful. The syndrome weight, or number of unsatisfied checks identified in the syndrome, is a representation of the number of errors in the data. In one or more embodiments, the syndrome weights are obtained from a decoder or dedicated hardware.

U.S. patent application Ser. No. 14/928,284, filed Oct. 30, 2015, entitled "Read Threshold Voltage Adaptation Using Bit Error Rates Based On Decoded Data," incorporated by reference herein, teaches that the bit error rate for the current read threshold voltage $V_i$ ($BER_S(V_i)$) can be estimated from the syndrome weight of the given page $P_j$. Generally, a syndrome is an estimate of the number of bits in error. The syndrome weight can be obtained, for example, from a syndrome weight calculator or a hard decision decoder for a specified number of iterations. In further variations, syndrome weights can be computed without first checking for convergence, or syndrome weight-based estimation of error counts can be omitted entirely. Thus, in various implementations, the syndrome weight-based estimation of error counts and the bit error rate computation for the current read threshold voltage $V_i$ can be performed independently, or can be combined.

The bit error rate can be computed from the syndrome weight, as follows:

$$Syndrome = Hx'$$

where x is the read value, H is the parity check matrix of a binary LDPC code and ' indicates a transpose operation. The syndrome is a vector of ones and zeroes, and the syndrome weight is the number of ones in the syndrome vector. A number of techniques exist to translate a syndrome weight to a bit error rate. For example, a syndrome weight can be translated to a bit error rate, as follows:

$$\text{Bit error rate estimate} = \text{Syndrome weight/average column weight of H matrix.}$$

A substantially optimal read threshold voltage is selected that minimizes a bit error rate obtained based on decoded data and/or a bit error rate obtained based on substantially minimum syndrome weights. Considered individually, each non-volatile memory cell has a particular stored (programmed) charge that corresponds to a device threshold voltage for that cell, and further corresponds to the logical bit values being stored in the cell. While, ideally, all of the cells in the non-volatile memory would have identical device threshold voltages for the logical bit values stored, in practice, for a variety of reasons, the device threshold voltages follow a probability distribution, e.g. a Gaussian distribution. Thus, considered in aggregate across a large number of cells, such as of a read unit, there are as many device threshold voltage distributions (e.g., Gaussian probability curves) as there are states per cell (two states per bit of storage per cell). That is, for N-bits per cell of storage, there are $2^N$ states and the same number of device threshold voltage distributions. Thus, $2^{N-1}$ different read reference voltages may be needed by read circuits in the non-volatile memory to distinguish between the $2^N$ states.

The device threshold voltage distributions vary from their initial/nominal distributions by one or more factors, such as read disturb, write disturb, and retention loss. More particularly, over time, temperature, and other factors related to use, the location of each of the device threshold voltage distributions can change with respect to the device threshold voltage axis. Such changes increase the likelihood of read errors that are performed using a read reference voltage value for the read threshold that was previously established based on the nominal device threshold voltage distribution. In some embodiments, when a hard-decision uncorrectable error is encountered in a read unit read from non-volatile memory, a series of read retry operations is performed to recover the read unit. The read retry operations include the controller re-reading the read unit with different reference voltages, as adjusted based on channel tracking.

The read retry reference voltage adjustment disclosed herein can be applied to both single-level cell (SLC) flash memories, where N=1, and to multi-level cell (MLC) flash memories, where N>1. Single-level cell memories store one bit per cell of storage, have two device threshold voltage distributions (one for zeroes and another for ones), and use a single read threshold, read reference voltage $V_{REF0}$. From lower to higher device threshold voltages, the two device threshold voltage distributions are known as the E (Erased) state and D1 (first Data) state. While arbitrary, a mapping or coding in some embodiments assigns logical one to the E state and logical zero to the D1 state. Thus, references to zeroes and ones are proxy references for respective decodings of the D1 state and the E state. Multi-level cell memories store more than one bit per cell, have more than two device threshold voltage distributions, and use multiple different read thresholds to distinguish the distributions. For example, a four level cell memory stores two bits per cell, has four device threshold voltage distributions, and generally uses three read thresholds (read voltage references $V_{REF1}$, $V_{REF2}$, and $V_{REF3}$). From lower to higher device threshold voltages, the four device threshold voltage distributions are known as the E (Erased), D1 (Data1), D2 (Data2), and D3 (Data3) states. While arbitrary, each of the four device threshold voltage distributions is also mapped (addressed) in accordance with a particular binary sequence, such as a Gray code sequence. Thus, references to one or more of the 11, 10, 00, and 01 states, are proxy references for respective decodings of the E, D1, D2, and D3 states.

For a single-level memory cell, a tracking module estimates the means and variances of the voltage distributions of states D1 and E, and sets the read reference voltage $V_{REF0}$ based on these distributions. The calculated $V_{REF0}$ will lie at the intersection of the distributions when zeroes (state E) and ones (state D1) are equally likely in the written data. A read control module initiates M data reads of the addressed page from the flash device to the read buffer, with the first read at a read reference voltage of $V_{REF0}$ and the subsequent read reference voltages at different levels around $V_{REF0}$ as determined by channel tracking of the means and variances of the voltage distributions of states D1 and E. For a multi-level memory cell, the tracking module estimates the means and variances of the voltage distributions of all states.

FIG. 1 illustrates a model of a non-volatile memory channel 100 in which channel tracking can be used to adjust read retry reference voltages in accordance with one or more embodiments of the present invention. Notably, two-bit inputs with four states are used in this example, although the read retry reference voltage adjustment disclosed herein is not limited to use with any particular bit width or number of states. For two input data bits 102, the two data bits 102 $b_1$, $b_2$ can be mapped to four possible states in a mapping 104. For example, value "11" for the two data bits 102 can be mapped to state $s_0$, value "01" to state $s_1$, value "00" to state $s_2$, and value "10" to state $s_3$. For a multi-level cell, the cell is programmed to a selected state 106 from the four possible states depending on the value of the two data bits 102. As voltages representing the selected state 106 are written to and read from the memory cell, noise 108 is added due to the programming process and other inefficiencies and disturbances, yielding a noisy cell voltage 110 y. The noise can be considered to be an additive white Gaussian noise (AWGN), with the noise variances being different depending on the signal transmitted.

Figure 2:
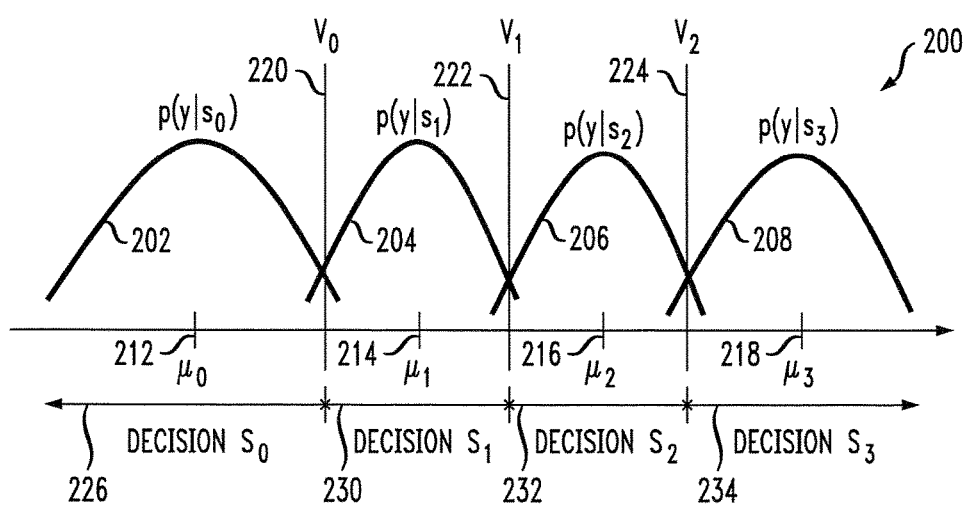
FIG. 2 is a graph of cell voltage distributions for a normal hard decision read in accordance with some embodiments of the present invention.

FIG. 2 is a graph 200 of cell voltage distributions 202, 204, 206, 208 for a normal hard decision read in accordance with some embodiments of the present invention. The resulting voltages read from the memory cell thus appear something like the distributions 202, 204, 206, 208 shown in the graph 200 of FIG. 2, rather than four distinct discrete voltage levels corresponding to the four states at the target state voltage levels 212, 214, 216, 218. Each distribution 202, 204, 206, 208 will have a mean roughly equal to the target voltage for the state, and the variance will depend upon the noise. Because the voltages on the memory cell are not accurate, the voltages read back can vary according to the distributions 202, 204, 206, 208. In some embodiments, during the initial read of the memory cell, reference voltages $V_0$ 220, $V_1$ 222 and $V_2$ 224 are used during a read to determine the state of the memory cell, returning hard decisions about the state of the memory cell.

In general, if the read voltage is below reference voltage 220, a decision (112, FIG. 1) indicates that the memory cell is determined to be in state $S_0$ 226. If the read voltage is above reference voltage $V_0$ 220 and below reference voltage $V_1$ 222, a decision indicates that the memory cell is determined to be in state $S_1$ 230, and a corresponding bit sequence 114 is generated. If the read voltage is above reference voltage $V_1$ 222 and below reference voltage $V_2$ 224, as decision indicates that the memory cell is determined to be in state $S_2$ 232. If the read voltage is above reference voltage $V_2$ 224, a decision indicates that the memory cell is determined to be in state $S_3$ 234, and a corresponding bit sequence 114 is generated.

In some embodiments, the read operation is divided into a process of reading least significant bit (LSB) pages and most significant bit (MSB) pages. States $S_0$ 226 and $S_1$ 230 correspond to a least significant bit value of 1, states $S_2$ 232 and $S_3$ 234 correspond to a least significant bit value of 0.

When reading the least significant bit, the reference voltage $V_1$ 222 is applied to the memory cell, and if the voltage on the cell is above reference voltage $V_1$ 222 the least significant bit is interpreted as having a value of 0. If the voltage on the cell is below reference voltage $V_1$ 222 the least significant bit is interpreted as having a value of 1. States $S_0$ 226 and $S_3$ 234 are less likely to result in a read error than states $S_1$ 230 and $S_2$ 232, because their distributions 202 and 208 are further from the intersection of distributions 204, 206 associated with reference voltage $V_1$ 222. When reading the most significant bit, states $S_0$ 226 and $S_3$ 234 correspond to most significant bit value of 1, and states $S_1$ 230 and $S_2$ 232 correspond to most significant bit value of 0. To read the most significant bit pages, the decision criterion is different and a pair of reference voltages $V_0$ 220 and $V_2$ 224 are applied. The levels of reference voltages $V_0$ 220, $V_1$ 222 and $V_2$ 224 are supplied by a channel tracking module in some embodiments of the invention.

When reference voltages $V_0$ 220, $V_1$ 222 and $V_2$ 224 are used during a read to determine the state of the memory cell, it can result in a misread due to overlapping regions for neighboring distributions. For example, if the actual written state is $S_0$ corresponding to target state voltage level 212, but the read voltage is at the upper edge of distribution 202 above reference voltage $V_0$ 220, the decision will incorrectly identify state $S_1$ 230. In these cases, if low density parity check decoding of the data read from the non-volatile memory does not converge on the correct values and correct the errors, a retry operation is initiated.

During the read retry operation, the non-volatile memory controller enters into a soft low density parity check decoding operation, in which soft data is used as the input to the low density parity check decoder. In retry, multiple reads of a memory page are performed at different read reference voltages to obtain a quantized version of the stored voltage on the cell. Afterwards, the multiple read pattern for each bit is then mapped to a log likelihood ratio (LLR) that represents the confidence level of the bit value being 0 or 1. Finally, the log likelihood ratios are passed as the soft data input to the low density parity check decoder to recover the written data.

Figure 3:
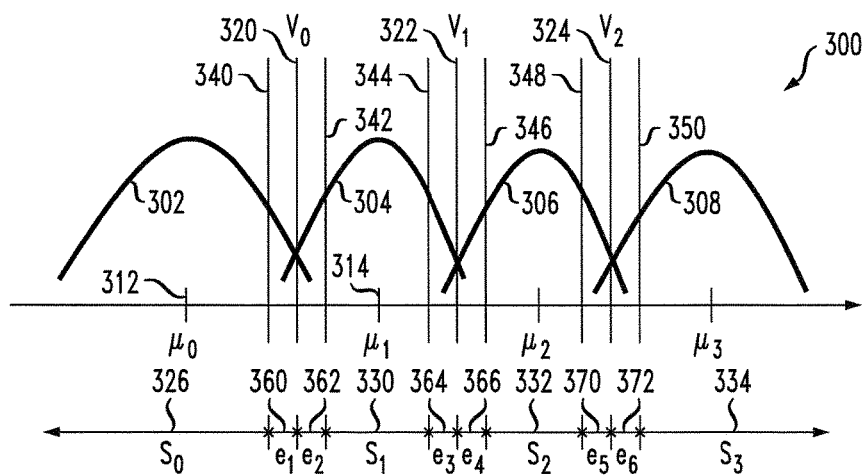
FIG. 3 is a graph of cell voltage distributions for cell voltages in different states for a retry soft decision read in accordance with some embodiments of the present invention.

FIG. 3 is a graph 300 of cell voltage distributions 302, 304, 306, 308 for cell voltages in different states for a retry soft decision read in accordance with some embodiments of the present invention. During read retries, soft decision data is generated by applying additional reference voltages 340, 342, 344, 346, 348, 350 in addition to reference voltages $V_0$ 320, $V_1$ 322 and $V_2$ 324. By performing additional read operations using different reference voltages (e.g., 344, 346), additional regions or states are defined, such as main state $S_0$ 326, $S_1$ 330, $S_2$ 332, and $S_3$ 334, and new intermediate states $e_1$ 360, $e_2$ 362, $e_3$ 364, $e_4$ 366, $e_5$ 370, and $e_6$ 372. Each is assigned a state value (e.g., {111}, {011}, {001}).

For example, when reading a least significant bit page, reference voltages 344, 322, 346 are applied in a series of read operations to determine if the least significant bit is a "0", with the memory cell in either state $S_2$ 332, or $S_3$ 334, or if the least significant bit is a "1", with the memory cell in either state $S_0$ 326, $S_1$ 330. Given three reference voltages 344, 322, 346, the hard decisions will have three bit values. Although reference voltages can be applied in a number of different orders, affecting the hard decision results, one example of the hard decision values for three reference voltages 344, 322, 346 applied in that order is as follows. If the read voltage is below all three reference voltages 344, 322, 346 to the left of reference voltage 344, the hard decision is {111}. If the read voltage is above reference voltage 344 and below reference voltages 322, 346, the hard decision is {011}. If the read voltage is above reference voltages 344, 322 and below reference voltage 346, the hard decision is {001}. If the read voltage is above all three reference voltages 344, 322, 346, the hard decision is {000}. The hard decision can be generated bit by bit by applying each of the three reference voltages 344, 322, 346 in three successive read operations.

When reading a most significant bit page, reference voltages 340, 320, 342 and 348, 324, 350 are applied in a series of read operations to determine if the most significant bit is a "0", with the memory cell in either state $S_1$ 330 or $S_2$ 332, or if the most significant bit is a "1", with the memory cell in either state $S_0$ 326 or $S_3$ 334. If the read voltage is below reference voltage 340, the hard decision is {111}. If the read voltage is between reference voltages 340 and 320, the hard decision is {011}. If the read voltage is between reference voltages 320 and 342, the hard decision is {001}. If the read voltage is between reference voltages 342 and 348, the hard decision is {000}. If the read voltage is between reference voltages 348 and 324, the hard decision is {100}. If the read voltage is between reference voltages 324 and 350, the hard decision is {110}. If the read voltage is above reference voltage 350, the hard decision is {111}.

Notably, the likelihood that the value read from a memory cell is correct differs based on the state that is read. For example, if the read retry results in a hard decision corresponding to state $S_0$ 326, the likelihood that the memory cell actually contains the value associated with target state voltage level 312 is greater than if the read retry results in a hard decision corresponding to state $e_1$ 360, because state $S_0$ 326 is further from the intersection of distributions 302 and 304 than state $e_1$ 360.

The hard decisions of read operations can be converted into soft decisions (log likelihood ratio values) based on the knowledge of the channel. The hard decision for state $S_0$ 326 will therefore have a higher log likelihood value than the hard decision for state $e_1$ 360. A log likelihood ratio for a memory cell contains the likelihood for each possible value of the memory cell that the cell contains that value. Thus, given a four state memory cell, the corresponding log likelihood ratio for data stored in the memory cell will have four probability or likelihood values, each giving the likelihood that the memory cell contains one of the four possible values. The log likelihood ratio values are generated from the read retry operation hard decisions in any suitable manner. Based upon the disclosure provided herein, one of ordinary skill in the art will recognize a variety of techniques and equations for calculating log likelihood ratio values from the read retry operation hard decisions. In some embodiments, the log likelihood ratio values are pre-calculated for each possible read retry operation hard decision, based on expected channel characteristics, and stored in a lookup table for use during operation.

In some embodiments, when data from a read retry operation fails to converge in the decoder, another read retry operation is triggered, with a greater number of reference voltages applied, giving higher quality soft decisions to be provided to the decoder. Such a process of increasing the number of reference voltages can be continued as long as desired until a maximum number of retries is reached and a read failure is signaled.

The adjustment of read retry reference voltages disclosed herein adjusts the reference voltages to achieve a prescribed log likelihood ratio table that is designed to achieve low density parity check decoding convergence with a lower number of read retries.

Initially, the location of the intersections between distributions (e.g., 302, 304) is not known. If the read reference voltages are positioned so that read values are captured near the center of distributions (e.g., 302), the full range of the resulting log likelihood ratios will not be used and the hard read bit error rate will not be minimized. For example, if log likelihood ratios are represented using three signed bits, the range of possible log likelihood ratios is from −7 to 7. In one or more embodiments, channel tracking is performed and an algorithm is applied to inversely find the read reference voltages that will use the full resolution of possible log likelihood ratios, rather than concentrating the log likelihood ratios at the edges of the available range.

In some embodiments, the channel tracking-based read reference voltage adjustment is applied in a read retry operation. In these embodiments, a hard read is performed first, reading hard decisions and decoding those hard decisions. The hard decisions can be mapped to log likelihood ratio values for a low density parity check decoder with a soft information input, by mapping a 0 value from the memory cell to a large negative log likelihood ratio value corresponding to a 0 value, and mapping a 1 value from the memory cell to a large positive log likelihood ratio value corresponding to a 1 value.

If the decoding fails, then the read retry operation is initiated, and a soft read is performed, yielding soft information or log likelihood ratios that are decoded. In a soft read, multiple reads of a page are performed at different read reference voltages to obtain a quantized version of the stored voltage on the memory cell. The multi-bit read patterns from the memory cell are mapped to log likelihood ratios that represent the confidence level of the bit value being 0 or 1, using a lookup table. The log likelihood ratios are passed to a decoder, such as, but not limited to, a low density parity check decoder performing soft decoding, to recover the written data. An algorithm is implemented to inversely identify the reference voltages that will populate the lookup table, under the assumption that the read voltage distributions have a substantially Gaussian distribution.

In some embodiments, the algorithm to inversely identity the reference voltages that will populate the lookup table to map to log likelihood ratios is a greedy algorithm, meaning that it considers all possible values of the read reference voltages before reaching a solution for the read reference voltages to be used. It is also an inverse algorithm, meaning that it starts with the possible log likelihood ratios and then identifies the read reference voltages that will result in quantized voltages that map to log likelihood ratios that use the full resolution. By utilizing the full log likelihood ratio resolution, the low density parity check decoding is able to converge on the correct written values in a lower number of read retries. With proper choice of read reference voltages, it is observed that the limited spectrum of log likelihood ratios does not impair performance of the low-density parity-check decoder. In some embodiments, the low density parity check decoding comprises a min-sum decoding algorithm, although the channel tracking-based read retry voltage adjustment is not limited to use with any particular type of decoder.

Figure 4:
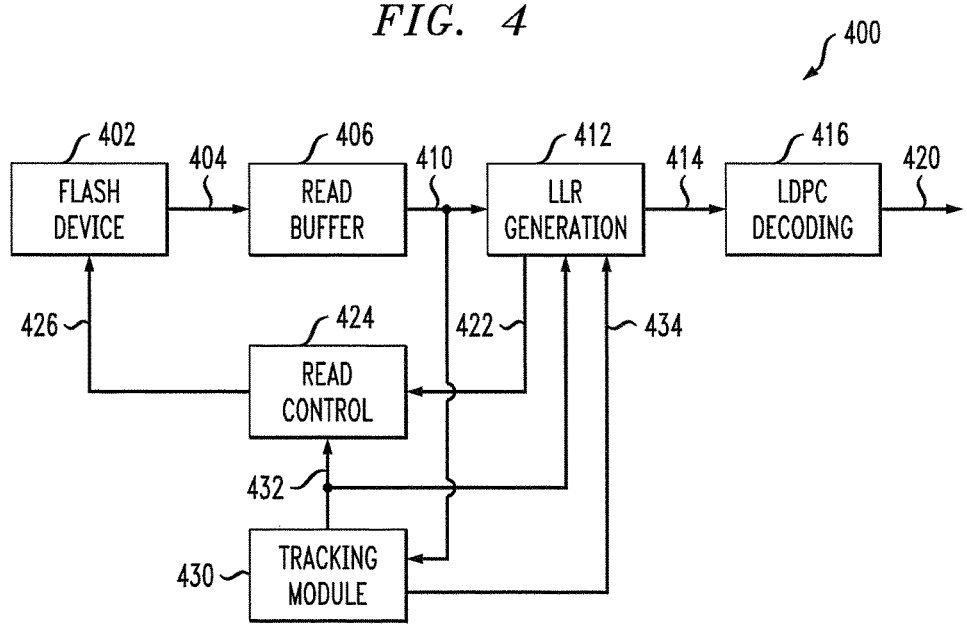
FIG. 4 illustrates a flash channel read path with channel tracking-based read retry voltage adjustment in accordance with some embodiments of the present invention.

FIG. 4 illustrates a flash channel read path 400 with channel tracking-based read retry voltage adjustment in accordance with some embodiments of the present invention. The read path 400 includes a flash device 402 having an array of memory cells, or any other type of non-volatile memory. Based upon the disclosure provided herein, one of ordinary skill in the art will recognize a variety of storage technologies that can benefit from the channel tracking-based read retry voltage adjustment disclosed herein.

Read reference voltages 426 are applied to the flash device 402 by a read control device 424 in a series of N reads. Each memory cell is read N times, and the N reads result in read data 404 containing N bits per memory cell as a quantized version of the stored voltage on the memory cell. The read data 404 is buffered in a read buffer 406, and buffered read data 410 from read buffer 406 is provided to a log likelihood ratio generation circuit 412 (or likelihood generator, which can also be adapted to use plain likelihood values). The N bits for a memory cell are mapped to log likelihood ratios for the memory cell in log likelihood ratio generation circuit 412. In some embodiments, the log likelihood ratio generation circuit 412 contains a lookup table that maps the read patterns in buffered read data 410 to log likelihood ratios.

A tracking module 430 receives the buffered read data 410 from the read buffer 406, or from any other suitable source. Generally, channel tracking techniques adapt to the changes in read threshold voltages to maintain a desired performance level. Adaptive tracking algorithms typically track variations in the solid state storage channel and consequently, help to maintain a set of updated channel parameters. The updated channel parameters are used, for example, to adjust read threshold voltages. United States Published Patent Application No. 2013/0343131, for example, filed Jun. 26, 2012, entitled "Optimization of Read Thresholds for Non-Volatile Memory," incorporated by reference herein in its entirety, discloses techniques for adapting read threshold voltages.

The tracking module 430 identifies the intersection point between neighboring voltage distributions (e.g., 302, 304) for a memory cell that corresponds to zero log likelihood ratio, and provides read reference voltage level $V_{REF0}$ 432, including the read reference voltage $V_{REF0}$ corresponding to the intersection. When the read reference voltage $V_{REF0}$ corresponding to the intersection is used for the soft read operation, it will result in a reduction in the bit error rate. The read reference voltage $V_{REF0}$ is used in some embodiments as the first read reference voltage of a read retry operation (see, e.g., 320), and additional read reference voltages around $V_{REF0}$ to obtain all possible log likelihood ratio values. The tracking module 430 thus generates the read reference voltage level $V_{REF0}$ 432 to be used in read retry operations. In other embodiments $V_{REF0}$ may not correspond to the intersection of the distributions depending on the tracking algorithm design, tracking inaccuracy, or the actual channel distributions deviating from Gaussian behavior in either the peak or the tail. In other situations, $V_{REF0}$ may coincide with the intersection of the distributions but may not be applied first and that would be accounted for in the calculations in log likelihood ratio generation circuit 412 and read controller 424.

The tracking module 430 also tracks the voltage distributions (e.g., 302, 304), calculating the means (e.g., $\mu_0$ 312, $\mu_1$ 314, etc.) and the $\sigma_0$, $\sigma_1$ for at least some voltage distributions (e.g., 304, 306). Given the assumption that the voltage distributions (e.g., 304, 306) have a Gaussian distribution, the voltage distribution means and variances 434 identify the intersection points between neighboring distributions. In some embodiments, the tracking module 430 calculates the voltage distribution means and variances 434 for each voltage distribution corresponding to each possible state in each memory cell. In some other embodiments, the tracking module 430 calculates the voltage distribution means and variances 434 for each voltage distribution corresponding to each possible state in groups of memory cells. The voltage distribution means and variances 434 can be calculated in any suitable manner based on the read data. As an example, the tracking module 430 can operate as disclosed in U.S. Published Patent Application No. 2013/0343131, filed Jun. 26, 2012, entitled "Fast Tracking for Flash Channels," incorporated by reference herein in its entirety. Based upon the disclosure provided herein, one of ordinary skill in the art will recognize a variety of techniques for calculating means and variances based on data sampled from Gaussian distributions. However, the tracking module 430 is not limited to any particular tracking algorithm. For example, in some other embodiments, the tracking module 430 tracks intersections without estimating means or variances. Even in cases where means and variances are not or cannot be tracked, in some embodiments, a pre-characterized table of means and variances for the purpose of determining reference voltages is used. In instances where the likelihood map is altered dynamically, reference voltage gaps are computed dynamically as well. Thus, the phrase "calculating means and variances" herein also refers to embodiments using pre-characterized tables of means and variances.

For a two-state memory cell, or single-level memory cell, the tracking module 430 estimates the means and variances of the voltage distributions of states "1" and "0", as well as the read reference voltage $V_{REF0}$ that most reduces the bit error rate and which likely lies at the intersection of those distributions when 0's and 1's are equally likely in the written data.

The tracking module 430 provides the voltage distribution means and variances 434 to the log likelihood ratio generation circuit 412 for use in updating the log likelihood ratio lookup table. The log likelihood ratio generation circuit 412 generates LLRs 414 that are processed by and LDPC decoding module 416 to generated a decoded value 420, in a known manner. The log likelihood ratio generation circuit 412 is used to calculate likelihood values for decoding purposes. The log likelihood ratio generation circuit 412 also determines where to place the other N-1 read reference voltages around $V_{REF0}$ 432 based on the voltage distribution means and variances 434 and on the read reference voltage $V_{REF0}$ 432 to obtain all possible log likelihood ratio values when the read patterns in buffered read data 410 are mapped to log likelihood ratios. The log likelihood ratio generation circuit 412 determines where to place the other N-1 read reference voltages around $V_{REF0}$ 432, updates the lookup table, and provides the N-1 read reference voltage levels 422 to a read controller 424. It is important to note that the division of functionality is not limited to the example embodiments disclosed herein. For example, in other embodiments, the tracking module 430 calculates and provides read reference voltages around $V_{REF0}$ 432 and provides those voltages to the log likelihood ratio generation circuit 412, rather than the log likelihood ratio generation circuit 412 determining where to place the other N-1 read reference voltages around $V_{REF0}$ 432, and these divisions of functionality are to be seen as equivalent.

The channel tracking-based read retry voltage adjustment algorithm is implemented in the log likelihood ratio generation circuit 412 based on the channel tracking information provided by the tracking module 430. The read reference voltages are stored in log likelihood ratio generation circuit 412 in some embodiments, as calculated based on the log likelihood ratio lookup table in log likelihood ratio generation circuit 412 and on the voltage distribution means and variances 434 from tracking module 430.

The read controller 424 controls the read retry operations in the flash device 402, providing each of the N read reference voltages (including $V_{REF0}$ 432) to be used when reading the memory cells in the flash device 402. The read controller 424 initiates N reads of a page, with the first read using read reference voltage $V_{REF0}$ in some embodiments, and with the subsequent N-1 reads at read references voltages around $V_{REF0}$ as determined by log likelihood ratio generation circuit 412.

As an example for a single-level memory cell, the bits are stored at two possible threshold voltages. The threshold voltages levels follow the Gaussian probability density function with equal variances for a centered intersection. The levels, denoted by logical 0 and 1, have means $\mu_0=-1$ v and $\mu_1=1$ v, respectively, which can be found by channel tracking. The optimal read reference voltage $V_{REF0}$ can be found in this example by channel tracking to be at 0 volts. A low density parity check decoder is used to decode the least significant bit pages using a soft decoding algorithm, using a four-bit log likelihood ratio having a range [-8, 7], although other fixed point representations can also be used.

Channel Estimation/Tracking

There are some issues that make accurate channel estimation by the tracking module 430 difficult. For example, data retention is hard to measure given operating temperature ambiguity. Also, different pages in a block may have different retention in a client application as blocks can be partially programmed for a long time during power off. In terms of noise due to read disturb, different blocks can experience different read counts and thus have different substantially optimal read reference voltages, $V_{REF}$, still, channel estimation tracking may need to estimate a single read reference voltage, $V_{REF}$, for pages in different blocks of different amounts of read disturb. This is in addition to variation in the manufacturing process that results in blocks of different data retention capabilities and different program disturb properties that are still tracked and receives one single read reference voltage, $V_{REF}$.

Other issues in a practical implementation of channel estimation exist beyond the granularity of estimated parameters. For example, any kind of practical read reference voltage, $V_{REF}$, calibration/tracking is relatively infrequent and cannot prevent occasional Hard LDPC decoding failures due to an out-of-date shift in the read reference voltage, $V_{REF}$.

Thus, there are limitations to channel estimation that affect the accuracy of channel parameters used in read retries for an outlier that fail decoding, as channel estimation (i.e. channel parameter tracking) only sample some flash pages to reach an estimate of channel parameters. For example, those sampled pages may not be representative, or only capture the average behavior of the flash block/blocks. Furthermore, pages that fail decoding have failed because average channel parameters were not suitable for them. Thus, read retry schemes that deal with failing pages need to estimate tailored channel parameters for the failing page.

Channel estimation usually finds an optimal read reference voltage, $V_{REF}$, based on a predefined metric (such as bit error rate, syndrome weight or disparity). The substantially optimal read reference voltage, $V_{REF}$, is for a collection of blocks that are grouped together for garbage collection and erased together (usually one or more blocks, those blocks that would collect the same program/erase count (PEC)), which can form the basis for defining page groups in one implementation. When a read comes from this block group, it will use the substantially optimal read reference voltage, $V_{REF}$, for that block group.

One or more embodiments of the invention provide a channel estimation algorithm that calculates read reference voltages, $V_{REF}$, on a smaller granularity, such as page populations derived from each block among a group of blocks with the same PEC, or even populations of pages from each block. Channel tracking would run on each population in a similar manner as conventional channel tracking techniques, e.g., averaging the read statistics of the smallest granularity and calculating the BER profile versus read reference voltage, $V_{REF}$, shift and then find the read reference voltage, $V_{REF}$, shift that minimizes the BER for that population. In further variations, the metric can be disparity or syndrome weight or another media quality metric.

Another way is to find the BER profile at multiple $V_{REF}$ shifts at smallest granularity (such as each page in block) and then find the optimal $V_{REF}$ of that page, then, the process is repeated for every page in the block. In that case, the number of pages that share the optimal $V_{REF}$ is counted and the $V_{REF}$ that is most prevalent will be ranked at the top of the list and the second most prevalent will be the runner up and so on.

Another way to classify populations is based on the BER (or disparity/syndrome weight) at a default $V_{REF}$, with all pages that have the same BER at the default $V_{REF}$ forming a population and tracking is run on the average statistics of that population. Then, the read reference voltages, $V_{REF}$, coming from all the populations is ranked based on size of those populations, or the BER at the default $V_{REF}$ for each population, or the relative improvement in BER between default and optimal $V_{REF}$ for that population.

Ranking Read Reference Voltages

In one or more embodiments, the ranking of read reference voltages, $V_{REF}$, can be based on the size of different populations. Thus, if a first population (X) of pages has a substantially optimal read reference voltage, $V_x$, and a second population (Y) of pages has a substantially optimal read reference voltage, $V_y$, and if the size of the first population (X) is bigger than the size of the second population (Y), then in the read retry algorithm, the read reference voltage, $V_x$, ranked highest for the first population (X) will be used before the read reference voltage, $V_y$, ranked highest for the second population (Y), as that will improve the time to obtain the decoded data, on average.

In another embodiment, the ranking of read reference voltages, $V_{REF}$, could be based on the quality of populations or how much a given shift in read reference voltage, $V_{REF}$, improves the bit error rate. For example, channel estimation can measure the improvement in bit error rate (BER) for a given read reference voltage, $V_x$, that was substantially optimal for the first population (X) relative to the BER of the default read reference voltage. $V_{REF}$, for the first population (X) and then do the same for the second population (Y). If the BER improvement is higher for the first population (X), then Vx will be ranked first for a read retry operation.

For example, if a failing page cannot be correlated as coming from a given population (e.g., from first or second population (X or Y)) and a read reference voltage, such as Vx or Vy, must be blindly used in read retry operation, a ranked order will improve performance. As used herein, a blind read retry operation does not know the best read reference voltage. $V_{REF}$, to use for a given page. Thus, the knowledge that read reference voltage, Vx, is more successful for the first population (X) means that, overall, the improvement in decoder success rate is higher if the read reference voltage, Vx, ranked first in order, although reads from the second population (Y) would be penalized.

One type of performance metric can based on raw measurement such as bit error rate, compared to genie data or a benchmark read (e.g., by comparing read data to known written data). A benchmark read can be a read at a pivot read reference voltage, $V_{REF}$, at which the error correction code (ECC) decodes, and hence a read that matches the original written data. As used herein, a pivot read reference voltages, $V_{REF}$, is the read reference voltages, $V_{REF}$, where the decoder can decode the data. Another method to obtain a benchmark read is to use the read at which the syndrome weight is substantially minimal among all reads. Once such read is found, then this pivot read reference voltage, $V_{REF}$, is recorded and further reads are compared to reads at this pivot read reference voltage, $V_{REF}$.

Other performance metrics can be decoder output statistics that measure the quality of the read indirectly, or are tied to an important system wide behavior. For example, channel estimation can record the number of local iterations that an LDPC decoder needs to successfully converge, which correlates to average system latency or tail latency. If estimation tracks the average iteration number then the performance captures average system throughput, while if estimation tracks the maximum iteration observed across reads then the performance tracks tail latency. Hence, channel estimation may choose the read reference voltage, $V_{REF}$, that substantially minimizes one or more of average system latency or tail latency.

Figures 5, 6:
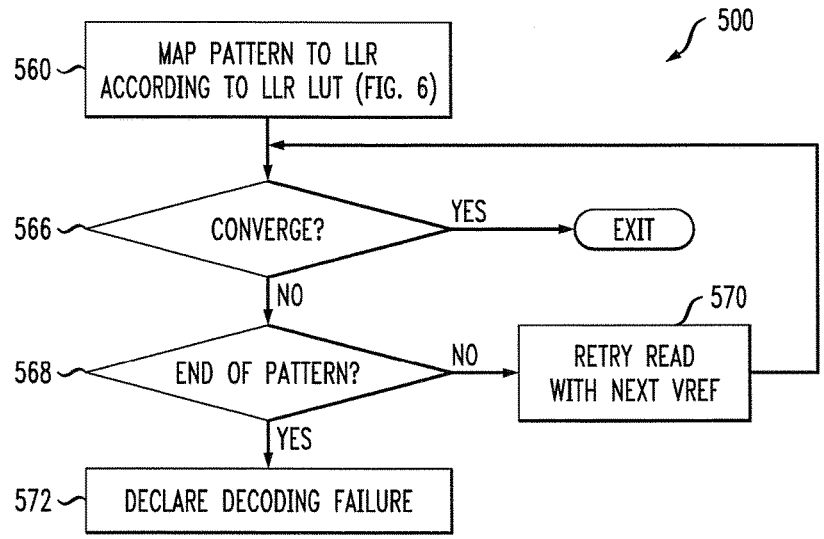
FIG. 5 is a flow diagram of a soft decision decoding process, according to one embodiment.
FIG. 6 is a lookup table of default log likelihood ratio values for a plurality of read retry operations.

FIG. 5 is a flow diagram of a soft decision decoding process 500 according to one embodiment. The soft decision decoding process 500 may be implemented, for example, by the read controller 424 of FIG. 4. As shown in FIG. 5, the soft decision decoding process 500 initially maps the obtained pattern to an LLR value during step 560, using the LLR LUT 600, discussed further below in conjunction with FIGS. 6 and 7. A test is performed during step 566 to determine if the decoding converges. If it is determined during step 566 that the decoding converges, then program control ends. If, however, it is determined during step 566 that the decoding does not converge, then the process 500 checks during step 568 to see if an end of the read retry pattern has been reached. If one or more additional read reference voltages of the pattern remain to be used, the next reference voltage is obtained during step 570, and program control returns to step 566. A loop around the step 566 to the step 570 and back again generally continues until either a convergence is reached in the step 566 or all of the read reference voltages have been tried per the step 568. If decoding has not been successful after a last read retry has been made and a last set of log likelihood ratio values has been used in the decoding, a decoding failure is declared during 572 and the process 500 ends.

In some embodiments, the log likelihood ratio (soft) values are calculated as part of a design process based on multiple rules. The rules generally include, but are not limited to, the following rules:

Rule 1: When two reads enclose the preferred read location, but that preferred read has not yet been done, the modified log likelihood ratio values for the decision region should be 0, which reflects equal likelihood of the binary decision values.

Rule 2: The first and last log likelihood ratio values should be the same to enable storage of only the lower page tables and, then, stitch the lower page tables together to generate upper page tables in case savings in variable space is needed.

Rule 3: The log likelihood ratio value signs at the right and left of the preferred read location have opposite signs, which is due to the natural single modality of noise distributions.

Rule 4: The log likelihood ratio values grow in magnitude as decision regions are further away from the preferred read locations indicating higher confidence in the binary decision value.

Rule 5: The log likelihood ratio value magnitudes grow almost linearly in the number of delta shifts away from the preferred read locations, which is due to the exponential decay in the tails of the noise distributions.

Rule 6: The first and last log likelihood ratio values are scaled down in magnitude from a maximum possible value in a fixed point representation to improve performance in a low density parity check decoding error floor since if write-side errors occur it results in faster saturation of the variable LLR of the decoding process, so scaling down LLR values delays the decoder getting stuck in near-codeword and improves error floor behavior as a result.

Rule 7: An exception to rule 6 happens if too many decision regions would have repeated log likelihood ratio values if scaling down, then, the largest possible log likelihood ratio value is used so as not to waste the available read retries. In practice, however, rules 6 and 7 are a tradeoff of error floor versus waterfall behavior, and a specific channel without write-side errors may benefit from following rule 7 rather than rule 6.

Rule 8: The first or last log likelihood ratio value is scaled down even further from that in rule 6 if the preferred read location is to the left of the leftmost read or to the right of the rightmost read at any read retry stage. There would be many more errors of lower decision confidence with this choice, thereby improving the convergence probability of the decoder as a result.

Rule 9: The log likelihood ratio (LLR) values assigned to each read retry region change sign at the location of the read voltage/voltages for multiple read retries that is (are) most likely to minimize the genie bit error rate BER (e.g., using known bit values) or a correlated metric to the BER.

FIG. 6 is a lookup table 600 of default log likelihood ratio values for the least significant bits (LSBs) for a plurality of read retry operations. Table 600 generally illustrates a lookup table for a two-bit per cell type memory. Table 600 is stored, for example, by read controller 424. A center of the voltage sweep window being retried, and thus the initial read retry in FIG. 3, is chosen to reduce the corresponding lower page and upper page bit error rates. Lowering the bit error rates uses side information, available in the form of the means μ and variances σ of the charge-state probability distributions 302, 304, 306, 308. However, if such information about the statistics of a certain state is not readily available, the corresponding log likelihood ratio values cannot be computed as the means and variances to plug into the likelihood computation formulas would not be available. In other scenarios, obtaining such information is costly, inaccurate, or is not supported by the flash architecture in an efficient manner.

In such situations, a default lookup table (e.g., LUT) can be used to map decision regions (e.g., multi-read patterns) into predefined log likelihood ratio values. In one or more embodiments, different tables can be maintained for different flash types and/or different channel conditions. For example, different lookup tables are stored for different program/erase cycle (e.g., PEC) points or read disturb cycles. In addition, different log likelihood ratio values can be maintained by the controller 424 for odd and even wordlines in even-odd architectures, or for single level cell (e.g., SLC) blocks, embedded single-level cell pages, or lower page only (e.g., LPO) pages. Those lookup tables can be modified dynamically (e.g., on the fly) based on some metric or based on some representative characterization of the flash part that pertains to the current measured channel condition (such as endurance, retention, or read disturb etc.) or specific to the current geometry (even/odd wordline, middle/edge wordline, or middle/edge block).

The lookup table 600 for LSBs in the embodiment of FIG. 6 is easily extendable to MSB pages with two or more sensing reference voltages by a person of ordinary skill in the art. Exemplary LLRs for MSBs are shown, for example, in FIG. 8. In general a flash page type can have multiple sensing voltages even above two, such as in TLC flash devices. In such cases, the site of the LLR lookup table 600 will grow accordingly as a function of the number of reference voltages to read a page. The decision regions surrounding each of the reference voltages can be distinguished by doing extra reads of other pages in the same wordline or based on the multiple-bit read patterns. In all cases, the concepts and rules disclosed herein can be extended to such pages to calculate LLRs for pages with multiple reference voltages.

In this manner, at each read retry, different LLR constellations are invoked based on metrics, such as disparity, syndrome weight of previous decoding attempt and/or history of such metrics. In one or more embodiments, the LLR lookup table 600 targets various scenarios, such as endurance, retention, read disturb, variation across dies and variation across pages.

In one or more embodiments, the LLR values stored in the table 600 (or generated dynamically in an alternate implementation) can be adjusted based on channel conditions and decoding performance. Specifically, the read retry algorithm can keep track of the history of successful read voltages and use them to re-rank the read reference voltages, $V_{REF}$, for the page populations.

Read Retry with Per-Population Ranking of Read Voltages

Figure 7:
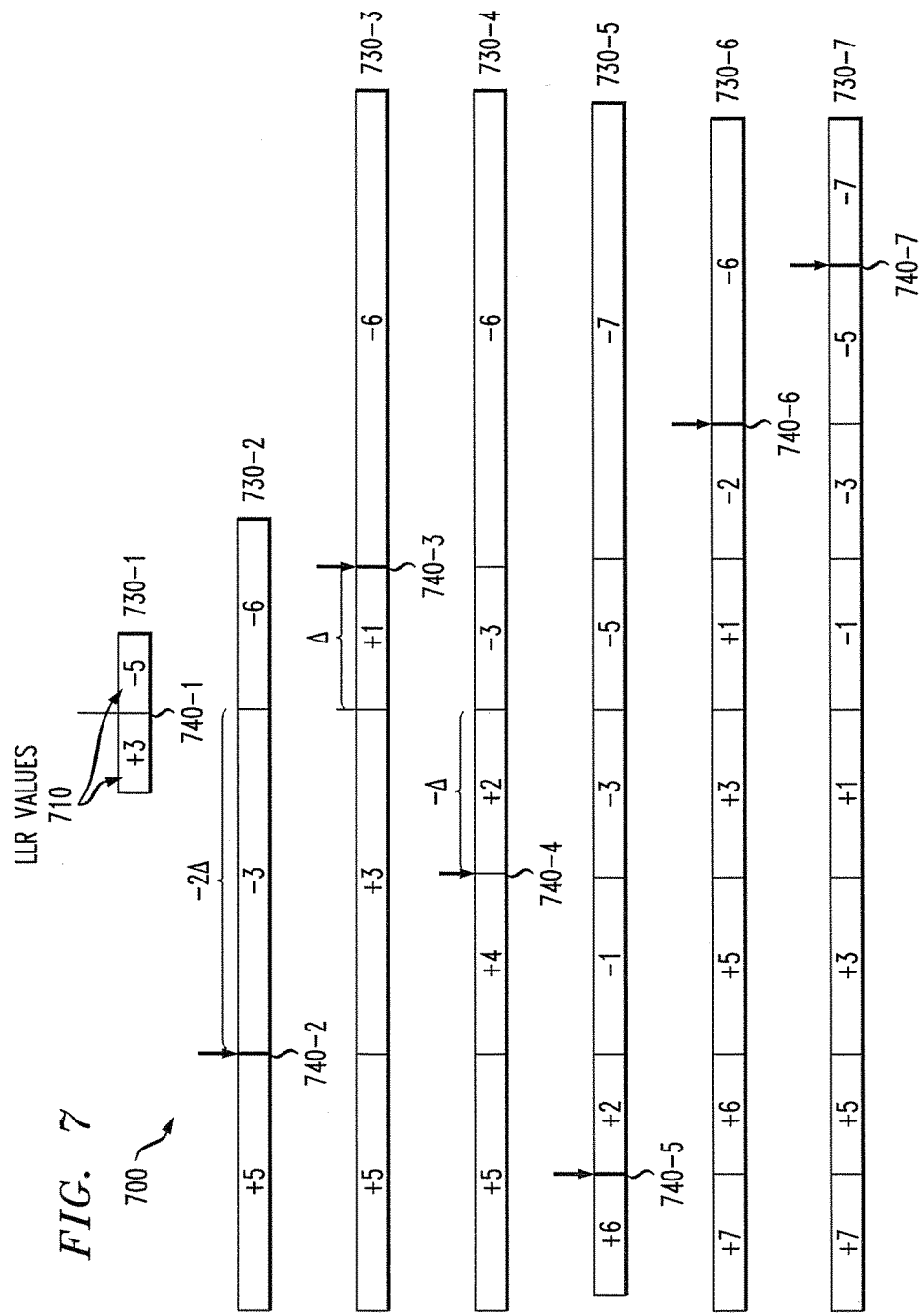
FIGS. 7 and 8 illustrate a number of successive read operations performed for a least significant bit and a most significant bit, respectively, in accordance with an embodiment of the invention, using example LLR value assignments from the lookup table of FIG. 6.

FIG. 7 illustrates a number of successive read retry operations 730 performed in accordance with an embodiment of the invention, based on a ranking of substantially optimal read voltages, $V_{REF}$, for a number of example page populations A, B, and C, for an example LSB page. Generally, the read retry mode is implemented to compensate for deficiencies in the channel tracking. The read retry mode is optionally enhanced with knowledge obtained from successful decodings. Following successful decodings, the read reference voltages, $V_{REF}$, can be re-ranked within each population, based on success rates for read retry.

For example, the channel estimation/tracking module 430 may provide the following ranking information for the LSB page, with three ranked read reference voltages, $V_{REF}$:

V0=65, frequency=50%, 0Δ=0 offset.
V1=53; frequency=30%, quantize to −2Δ offset→read at 55.
V2=71; frequency=15%, quantize to +Δ offset→read at 70.

The read reference voltages, $V_{REF}$, have been ranked based on the size of the populations A, B, C.

As discussed above, the ranked list is obtained by running channel estimation to track different populations of pages. Channel estimation is performed with multiple reads of different populations and then aggregate statistics are obtained based on a predefined performance metric, such as bit error rate or disparity.

In the example of FIG. 7, 50% of a first population A had an optimal $V_{REF}$ at a zero shift from default read, in accordance with an embodiment 700 of the invention. With a granularity of measurement equal to $\Delta$, 30% of a second population B had an optimal read at $-2\Delta$, and 20% of a third population C had an optimal read at $+\Delta$. As a result, the retry steps 730 in FIG. 7 initially use the read voltage $V_{REF}$ that is best for a majority of the population (e.g., population A). If a source of the read operations is known to come from population (B), then it would make sense to first read using the optimal $V_{REF}$ setting for population B. The assumption here, however, is that the source of the read operation cannot be verified or correlated with a $V_{REF}$ in the optimal list obtained by channel estimation 430.

As shown in FIG. 7, for the initial read retry operation 730-1, which can be the past failed normal read or a fresh read retry read, the log likelihood ratio generation circuit 412 (FIG. 4) places the reference voltage 740-1 at $V_{REF}$. Thus, the first read retry operation 730-1 is performed at a default $V_{REF}$ (i.e., $0\Delta$ shift from default) and LLR values 710 were assigned as +3 and −5 (e.g., using LLR value assignments from the lookup table 600 of FIG. 6) for the two decision regions that result from the first read 730-1. This reference voltage is in the middle, where the voltage distributions intersect and are equal so that the read result is equally likely to be in either state (minimizing the probability of bit error and maximizing probability of decoding success). Thus, in the first read retry 730-1 in some embodiments, the reference voltage is placed at 0 volts offset from default or initial voltage, and the log likelihood ratio constellation, the log likelihood ratio values to which the resulting two-state read data is mapped, is {+3, −5}. Generally, the first read is geared towards best results for population A with no side knowledge indicating whether or not the read came from population A. The LLR values 710 are based on the side information that 30% of the reads are at the left side of the $1^{st}$ read, so the LLR magnitude is dampened at the left decision region based on that assumption.

For the second read retry operation 730-2 in some embodiments, the log likelihood ratio constellation is set at {+5, −3, −6}. The second read operation 730-2 is obtained at $-2\Delta$ from the default read since if a failure had occurred at the first read then it is more likely to be due to reading from population B rather than population C. An additional reference voltage 740-2 is thus set at a voltage offset $-2\Delta$ with respect to the first reference voltage 740-1.

Thus, the second read retry operation 730-2 includes reads using 740-1 ($V_{REF0}$) and the additional reference voltage 740-2 set at $VR_{REF0} - 2\Delta$. In at least one embodiment, for the second read retry operation 730-2, only one new read operation is performed using reference voltage 740-2, and the prior readings for reference voltage 740-1 is reused (and similarly for subsequent read retry operations 730). The two reference voltages 740-1 and 740-2 result in read data representing three possible states, which are mapped to the three-entry log likelihood ratio constellation {5, −3, −6}.

Thus, by aggregating the two read operations, three decision regions are available. The LLR assigned to those three decision regions are +5, −3, and −6 from left to right, as shown in FIG. 7.

In one or more embodiments, $\Delta$ is programmable with a certain default value for a specific flash type, channel condition, or page locality. In an offline determination of the $\Delta$ voltage for a specific flash type, several targets are to be achieved.

If the ECC/LDPC decoder still fails at read 730-2, then read 730-3 is obtained at a voltage 740-3 that is $+\Delta$ from default which is optimized for population C. By aggregating the three read operations 730-1 through 730-3, there are four decision regions with assigned LLR +5, +3, +1, and −6 from left to right, as shown in FIG. 7 for read retry operation 730-3. The LLR changes sign at $+\Delta$ as it is more likely that the failures occurred, due to reading from population C while using the substantially optimal $V_{REF}$ from the list for populations A, and B.

The order of reading at Va=0, Vb=$-2\Delta$, and Vc=$+\Delta$ is to minimize the time to obtain the data on average. If the goal is to minimize tail latency (i.e., the number of read operations for the worst case scenario), then a different ranking of the population would make more sense that is not based on size of the population only but also on the probability of failure using the optimal $V_{REF}$ versus the wrong $V_{REF}$ for another population. In that case, channel estimation needs to provide the failure rate of reading any population with the $V_{REF}$ of another population and then the order can be obtained that minimizes the maximum number of read operations for a certain percentile of codewords. For example, if a maximum number of read operation is three for 99% of reads, then Va, Vb, and Vc can be ordered so that only 1% of reads would fail to decode using the chosen order after three reads.

With reference to FIG. 7, after the third read; if decoding still fails, then more page reads are performed to enhance the quality of soft information. The fourth page read 730-4 adds a read at a voltage of 740-4 ($-\Delta$ from default $V_{REF}$) to get a smaller granularity in the inner decision regions. The LLR sign change, however, is still at default $V_{REF}$, which is matched to the optimal $V_{REF}$ of population A. Thus, the fourth read provides more accurate soft LLR for failing pages resulting from reading population A.

If the fourth read operation 730-4 fails then the fifth read 730-5 is performed at $-\Delta$ below optimal $V_{REF}$ of population B (which is $-2\Delta$ below default $V_{REF}$), which is also $-3\Delta$ below default $V_{REF}$. The fifth read operation 730-5 provides more accurate soft information for population B, where the LLR changes sign at the substantially optimal $V_{REF}$ of population B, i.e., $-2\Delta$.

If the fifth read operation 730-5 fails, then the sixth read operation 730-6 is performed at a voltage 740-6 of $+\Delta$ above the optimal $V_{REF}$ of population C (which is $+\Delta$ above default $V_{REF}$), which is also $+2\Delta$ above default $V_{REF}$. The sixth read operation 730-6 provides more accurate soft information for population C, where the LLR changes sign at the substantially optimal $V_{REF}$ of population C, i.e., $+\Delta$.

If the sixth read operation 730-6 fails, then the seventh read operation 730-7 is performed at a voltage 740-7 of $+3\Delta$ above the optimal $V_{REF}$ of population A. The seventh read operation 730-7 provides more accurate soft information for population A, where the LLR changes sign at the substantially optimal $V_{REF}$ of population A, i.e., default $V_{REF}$.

Figure 8:
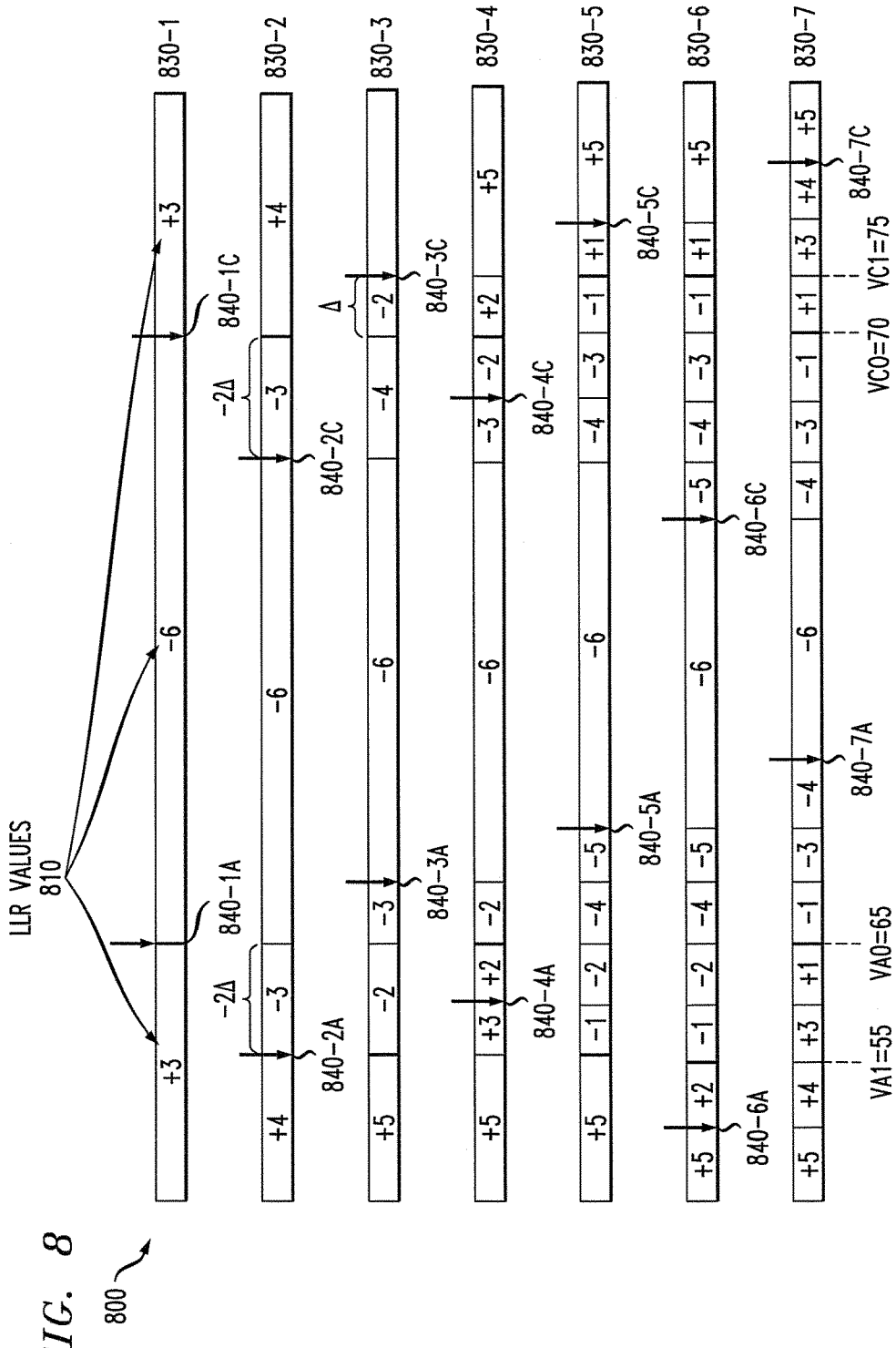

FIG. 8 illustrates a number of successive read retry operations 830 performed in accordance with an embodiment 800 of the invention, based on a ranking of substantially optimal read voltage, $V_{REF}$, pairs ($V_A$, $V_C$) for an MSB page for two example page populations X, Y. Generally, the read retry mode is implemented to compensate for deficiencies in the channel tracking.

In the example of FIG. 8, population X has a pair of optimal read reference voltages, $V_{REF}$, to read the MSB page: reference voltage $V_A$ is at the default $V_{REF}$, and a shift of $+\Delta$ from the default voltage for reference voltage $V_C$. Population Y has an optimal $V_{REF}$ of $-2\Delta$ from the default voltage for population $V_A$, and $+2\Delta$ above the default voltage for $V_C$.

Populations X and Y may be classified based on the optimal pair $(V_A, V_C)$ or maybe classified based on other metrics. Once the list of optimal read reference voltages, $V_{REF}$, is obtained through an offline or on-the-fly channel estimation procedure, then read retry can be optimized based on the time to obtain data requirements.

The optimal pair $(V_A, V_C)$ may be found separately using separate metrics if the cells of a page can be distinguished in the channel estimation algorithm. For example, a channel estimation algorithm can measure the page disparity (i.e., normalized difference of number of binary ones and zeroes) while fixing pair $V_A$ to some value and sweeping $V_C$. Using such techniques, channel estimation may obtain the optimal $V_A$ value and a second runner up optimal $V_A$, while $V_C$ is set to the default $V_{REF}$. In the same way, if $V_C$ can be fixed to the default value, or last optimal value, $V_A$ is swept to obtain multiple reads and to find the optimal $V_{REF}$ and the runner up optimal $V_A$. In this case, the optimal value and runner up value for $V_{REF}$, for $V_A$ and $V_C$ can be mixed and matched to obtain four populations for retry optimization. In the read retry of FIG. 8, there are two populations by pairing the optimal $V_A$ and $V_C$ in one pair to form population X, and pairing the runner up $V_A$ and runner up $V_C$ to form the second pair for population Y.

In FIG. 8, the first read 830-1 can be chosen based on the optimal read pair for population X. While in the second read 830-2 of this example setting, there is a conflict in the runner up pair for population Y as positive and negative shifts in reference voltage are paired. The reason for the conflict in this example situation is that the gray mapping of voltage states results in the positive shift in $V_C$ and negative shift in $V_A$ delivering the same bit reversal polarity, i.e., a bit in state '1' becomes '0' for the upper/MSB page. As a result, if the controller has no access to the write data anymore, then in the second read 830-2, all cells will have the same polarity change and there is no as to assign asymmetric LLRs to the left and right side, corresponding to $V_A$ and $V_C$, respectively. In addition, the only way to differentiate left and right side in that case is to obtain a read of the lower/LSB page at a suitable $V_B$ setting in between $V_A$ and $V_C$. If a read of the lower page is possible, then the optimal read reference voltages, $V_{REF}$, of population Y can be used in the second read 830-2.

The channel estimation/tracking module 430 may provide the following example information for the MSB page:

$V_{A0}$=65, frequency=50%, $0\Delta$=0 offset; $V_{C0}$=70, frequency=60%, $+\Delta$ offset; and $V_{A1}$=53; frequency=30%, quantize to $-2\Delta$ offset; $V_{C1}$=75, frequency=25%, $+2\Delta$ offset FIG. 8 shows a retry example where write data is not available and extra reads of the paired lower page on the same wordline is not desired. In this case, the second read 830-2 uses the optimal $V_A$ shift for both $V_A$ and $V_C$ so that the controller can differentiate cells using the difference in polarity change and assign asymmetric LLR to left and right cells. This is important to use the retry settings tailored to the failing page. In this case, the second read 830-2 of $V_A$ will be $-2\Delta$ below the default voltage (840-1A), which is the runner up optimal $V_{REF}$ for $V_A$ (840-2A), while for $V_C$, using $-2\Delta$ below the first read operation 830-1 will place the second read 830-2 of $V_C$ (840-2C) at $-\Delta$ below the default voltage (840-1C). Despite the constraint to shift $V_A$ and $V_C$ in the same direction, the LLR sign change location is chosen to be as close to the optimal or runner up optimal voltage as available by the aggregated reads. Thus, the change of sign of $V_C$ in the second read operation 830-2 is at $+\Delta$ from default. Thus, the optimal $V_C$ of population X is mixed with the runner up optimal $V_A$ of population Y.

In the third read 830-3, the shift of $V_C$ is geared towards matching the optimal runner up for $V_C$ (840-3C), which is $+\Delta$ above the first read operation 830-1 and $+2\Delta$ above the default value, while if the same shift is used for $V_A$, then $V_A$ (840-3A) will be $+\Delta$ above the default value of $V_A$. Thus, in the third read operation 830-3, the change of sign is still at the pair of runner optimal $V_A$ and $V_C$ values for population Y.

In the fourth read operation 830-4, $V_A$ is read at $-\Delta$ offset (840-4A) from default and $V_C$ is read at a $-\Delta$ offset (840-4C) from the first read operation 830-1, i.e., at default $V_C$. The change of LLR sign is at the default value of $V_A$ and $+\Delta$ from the default value of $V_C$, which are the pair of optimal read reference voltages, $V_{REF}$, for population X.

In the fifth read operation 830-5, $V_A$ is read at an offset of $+2\Delta$ (840-5A) from the default value and $V_C$ is read at an offset of $+3\Delta$ (840-5C) from the default $V_{REF}$. The change of LLR sign is at an offset of $-2\Delta$ from the default $V_A$ value and a $+2\Delta$ offset from the default value of $V_C$, which are the pair of runner up optimal read reference voltages, $V_{REF}$, for population Y.

In the sixth read operation 830-6, $V_A$ is read at an offset of $-3\Delta$ (840-6A) from the default value and $V_C$ is read at an offset of $-2\Delta$ (840-6C) from the default value of $V_C$. The change of LLR sign is at an offset of $-2\Delta$ from the default $V_A$ value and a $+2\Delta$ offset from the default value of $V_C$, which are the pair of runner up optimal read reference voltages, $V_{REF}$, for population Y.

In the seventh read operation 830-7, $V_A$ is read at an offset of $+3\Delta$ (840-7A) from the default value and $V_C$ is read at an offset of $+4\Delta$ (840-7C) from the default value of $V_C$. The change of LLR sign is at the default value of $V_A$ and a $+\Delta$ offset from the default value of $V_C$, which are the pair of optimal read reference voltages, $V_{REF}$, for population X.

The disclosed techniques for per-population ranking of read reference voltages, $V_{REF}$, can be employed for TLC and QLC (quad-level cell) flash, as would be apparent to a person of ordinary skill in the art by someone skilled in the art.

In one or more embodiments, once LDPC decoding succeeds at a certain voltage shift, a count of the successful decoding is maintained for each read reference voltage, $V_{REF}$, and the success counts can be used to re-rank the list of read reference voltages, $V_{REF}$.

Obtaining Cumulative Distribution Functions From Syndrome Weights

According to another aspect of the invention, a failing page can be read multiple times to obtain bit error cumulative distribution functions (CDFs). The CDFs can be used to calculate the LLRs that are assigned to each decision region when generating soft decisions to be passed to the LDPC decoder.

As noted above, at least one embodiment dynamically estimates channel parameters, for example, on the fly or in real-time, for a failing page. Channel and retry parameters are calculated on the fly based on a channel tailored to the failing page. In this manner, the read retry scheme is tailored to a failing page by calculating the read retry settings and channel parameters on the fly based on read retry operations of the failing page. Since the original data for a failing page often cannot be obtained, as the decoder cannot converge, tailored channel parameters are calculated based on the count of unsatisfied parity checks (syndrome weight). It has been found that the unsatisfied parity check count strongly correlates with the bit error rate of the page being read for low density parity codes (LDPC). Multiple read retry operations are performed of the failing page or code words and a probability density function (PDF), cumulative distribution function (CDF) or another cell voltage probability distribution of cell voltages for each possible cell state, based on the estimated written data, is generated for the cell voltage derived from the syndrome weight profile of the multiple read retry operations. Once the syndrome weight profile is obtained, then the substantially optimal read reference voltage of the failing page can be found (corresponding to the read operation having a substantially minimum syndrome weight). In addition, the PDF can be fit to a certain underlying distribution to calculate the first order moments and second order moments of the distribution. Obtaining the moments of the cell voltage PDF can be useful to obtain the log-likelihood ratios decisions based on multiple reads to enable soft decision decoding of LDPC, as discussed further below.

If the decoder can obtain the genie data (e.g., the data that was written), a true profile of the directed bit error rate (BER) can be found to compute log likelihood ratios (LLRs) of decision regions. If the decoder cannot decode the true data, however, then the codeword with a minimum syndrome weight can be used to compute an approximate directed BER profile in order to compute BER.

FIG. 9 illustrates two example cumulative distribution functions 900 associated with written states 01 and 00. Generally, as discussed hereinafter, the example cumulative distribution functions 900 comprise cumulative error counts as a function of read reference voltages, $V_{REF}$, that are processed to dynamically select LLR values for each region of the CDFs (e.g., region 950 spanning $V_{-3}$ to $V_{-2}$). In this manner, substantially optimal LLRs for the failing page are dynamically determined, to decode the failing page. As discussed further below in conjunction with FIGS. 11 and 13, the cumulative distribution functions are obtained for a failing page by comparing the estimated or actual written data for the page to the data that was read for the page, for a plurality of read reference voltages, $V_{REF}$.

For example, a dedicated hardware accelerator, discussed further below in conjunction with FIG. 11, can compute the bit error rate by applying an XOR operation to two pages to determine the differences and bit error rate, in a known manner. The $CDF_{0 \to 1}$ shown in FIG. 9 indicates valid data to the left of the intersection 910, and errors to the right of the intersection 910. The $CDF_{1 \to 0}$, on the other hand, indicates valid data to the right of the intersection 910, and errors to the left of the intersection 910.

As discussed further below in conjunction with FIG. 14, the CDFs 900 are obtained by reading a failing page at multiple read reference voltages, $V_{REF}$, and then measuring the number of cells that have changed sign (e.g., have errors). As shown in FIG. 9, two CDFs 900 are obtained based on written states "01" and "00". The two CDFs 900 are used to calculate the LLR of any decision region, such as region 950, that arises during retry. For example, the LLR of a region 950 encapsulated by reference voltages $V_{-3}$ and $V_{-2}$ is found by the following equation:

$$LLR = LOG(CDF_{0 \to 1}(V_{-3}) - CDF_{0 \to 1}(V_{-2})) - LOG(CDF_{1 \to 0}(V_{-2}) - CDF_{1 \to 0}(V_{-3})) \quad (1)$$

Since written data is often not available, the $CDF_{0 \to 1}$ and $CDF_{1 \to 0}$ can be found from the LDPC decoder's output syndrome weight, which is strongly correlated with the true bit error rate of the read page, in which the read that corresponds to the minimum syndrome weight is used as the estimates written data to calculate the CDF. In FIG. 9, the LLR of each decision is the logarithm of the ratio of probability of the cell being in the decision region, which using logarithm properties is the difference between the log of the probability that the cell comes from voltage distribution '01' and the log of the probability that the cell comes from voltage distribution '00'. The LLR as a result is negative for decision regions above V0 (intersection 910) and positive for decision regions below V0 (intersection 910).

In equation (1), the probability that the cell was written to voltage state '01' but ends in the decision region that is encapsulated by reference voltages $V_{-3}$ and $V_{-2}$ $CDF_{0 \to 1}(V_{-3}) - CDF_{0 \to 1}(V_{-2})$. Likewise, the probability that the cell was written to voltage state '00' but ends in the decision region that is encapsulated by reference voltages $V_{-3}$ and $V_{-2}$ is $CDF_{1 \to 0}(V_{-2}) - CDF_{1 \to 0}(V_{-3})$.

If there is little $V_{REF}$ granularity in the BER CDF profile (i.e., few measurement point of the CDF), then it makes sense to find the LLR for each decision region based on a predetermined $\Delta$, and decide decision regions based on a read sequence and optimal $V_{REF}$ histogram. Otherwise, if $V_{REF}$ can be measured with a finer granularity, then it makes sense to start with a predetermined LLR and then find a corresponding $\Delta$. Thus, to match an LLR table with a specified granularity, the controller can use the CDF functions measured as above to find the reference voltages encapsulating the decision region.

FIG. 10A illustrates two example cumulative distribution functions 1000 associated with written states 01 and 00. Generally, as discussed hereinafter, the example cumulative distribution functions 1000 that are processed to find a read reference voltage, $V_{REF}$, that gives a desired LLR value. In this manner, when one or more desired LLRs are already known (for example, when you want to equalize the read operation to get the desired LLR), the read reference voltage, $V_{REF}$, indicating where to read to get the desired LLRs, can be obtained by processing the CDFs 1000 of FIG. 10A.

As shown in FIG. 10A, starting with a substantially optimal $V_{REF}$ or a default $V_{REF}$, an LLR is calculated at each possible $V_{REF}$ until the desired LLR is found. The retry delta can be recorded and used in the read retry operation of other failing pages of the same characteristics as the one used to measure the bit error CDFs.

FIG. 10A provides a reverse lookup of substantially optimal $V_{REF}$ read locations that will give rise to the predetermined LLR tables 600 (FIG. 6) that are used to map a decision region to the LLR used in soft decoding. The unknown value in FIG. 10A is the $V_{REF}$ value and the known value is the LLR.

FIG. 10B illustrates an implementation of pseudo code for a search technique 1050 to find an optimal read reference voltage, $V_{REF}$, from the CDFs of FIG. 10A when one or more desired LLRs are known, according to one embodiment of the invention. As shown in FIG. 10B, the process increments the read reference voltage, $V_{REF}$, in the range $V_{-K}$ to $V_{+K}$, in a "for" loop, and then breaks when the desired LLR value is obtained, according to equation (1).

Alternatively, an analytic formula can be obtained to calculate read reference voltages, $V_{REF}$, based on LLRs.

Figure 11:
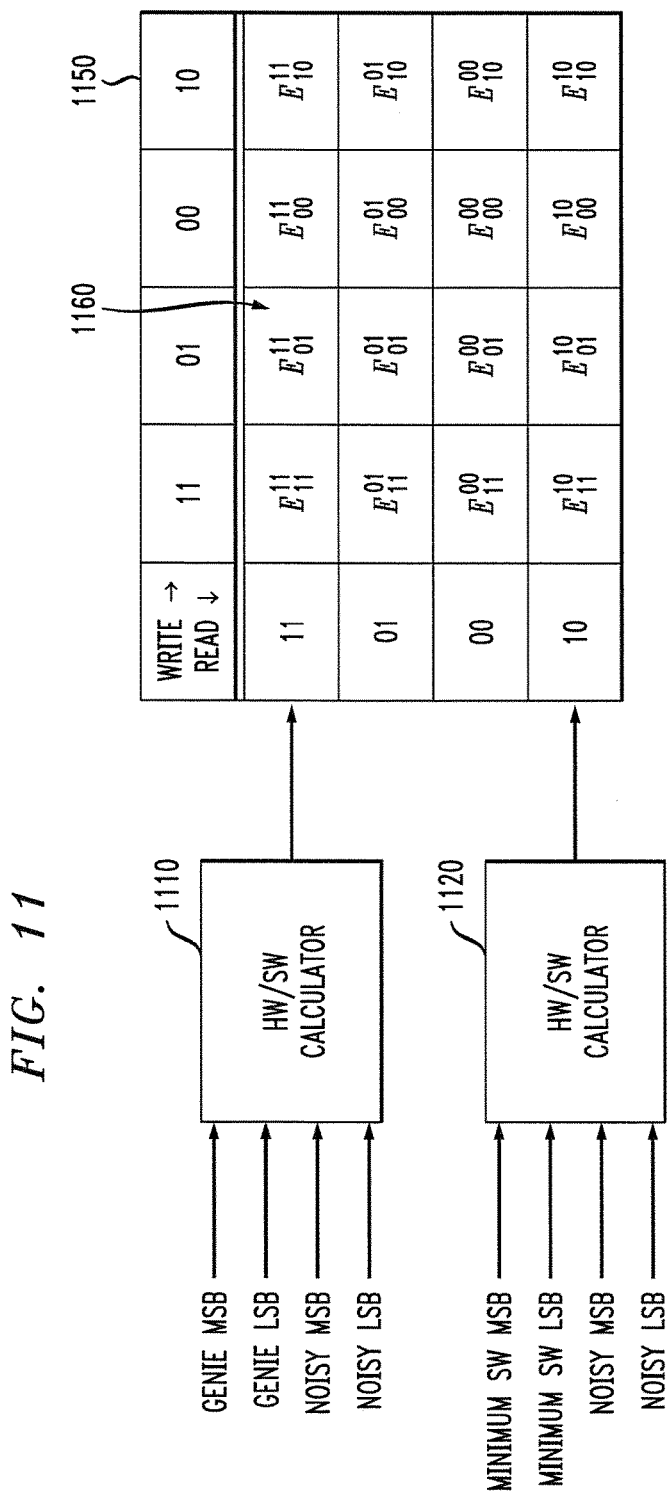
FIG. 11 illustrates a pair of calculators that calculate bit error rates used to derive the cumulative distribution functions of FIGS. 9 and 10A.

FIG. 11 illustrates a pair of calculators 1110, 1120 that calculate bit error rates in a table 1150 that are used to derive the cumulative distribution functions, as discussed below. The calculators 1110, 1120 can be implemented in hardware (HW) or software (SW). The calculator 1110 determines the bit error rates 1150 (e.g., $E_{01}^{11}$) by comparing genie data (i.e., the data that was written) to the noisy read data for an MSB page and an LSB page, for example, using an XOR function, in a known manner. If the LDPC decoder can find the genie/written data, a true profile of the directed BER can be found by the calculator 1110 to compute the LLR of decision regions. For each read at a different read reference voltage, $V_{REF}$, the written MSB/LSB data is compared by the calculator 1110 to the read LSB/MSB data and the observed states can be binned to obtain the probability transition table 1150, where $E_{01}^{10}$, for example, indicates the probability of writing "10" to MSB/LSB bits of the cell while reading "01". The calculator 1110 can calculate the 16 transition probabilities in table 1150, of which the diagonal entries are the probabilities of no error, the first bi-diagonals are the probability of error between adjacent states, which are the most likely errors, and the rest are error between non adjacent states. Errors between adjacent states correspond to six directed BER CDFs that can be used to estimate three optimal read reference voltages, $V_{REF}$, in an MLC flash.

If the decoder cannot decode the true data, then the codeword with minimum syndrome weight can be used as an estimate of the written data, to compute an approximate directed BER profile in order to substitute for the true BER curves. The calculator 1120 determines the bit error rates 1150 by estimating the data that was written (using a minimum syndrome weight (SW) among a plurality of read operations using different read reference voltages, $V_{REF}$ and comparing the estimated written data (referred to as minimum SW LSB and MSB)) to the noisy read data for the MSB page and LSB page, according to one embodiment of the invention. A given cell in the table 1150, such as example cell 1160 ($E_{01}^{11}$), indicates the probability that a particular value was written (such as '01') given that a particular value was read (such as '11'). In the case of calculator 1120, the written data is an estimate obtained using the minimum syndrome weight.

In one or more embodiments, the bit error rate values in table 1150 are used to obtain the cumulative distribution functions, as follows:

$$CDF_{0\to1}^{lsb} = E_{10}^{11} + E_{00}^{01} + E_{10}^{01} + E_{00}^{11}$$

$$CDF_{1\to0}^{lsb} = E_{11}^{10} + E_{01}^{00} + E_{11}^{00} + E_{01}^{10} \qquad (2)$$

In this manner, the transition probabilities from table 1150 can be used to compute the directed BER CDF using equation (2) by summing over all possible states of the other bits in the wordline. For example, to find the CDF of an LSB bit for error transition 0→1, then all possible X and Y transitions are summed in $E_{Y0}^{X1}$, where X and Y are all possible MSB bit transitions X→Y. Also, to find the CDF of an LSB bit for error transition 1→0, then all possible X and Y transitions are summed in $E_{Y1}^{X0}$, where X and Y are all possible MSB bit transitions X→Y. Then, the LSB LLR can be found using equation (1).

As indicated above, the derived cumulative distribution functions are used to calculate LLRs, in accordance with equation (1) and the techniques of FIG. 9, and/or to determine an appropriate read reference voltage, $V_{REF}$, to use to obtain a desired LLR, in accordance with the techniques of FIGS. 10A and 10B.

To keep the noise small in estimating LLRs, then a threshold can optionally be used so that the minimum syndrome weight code word is only used if the syndrome weight at a substantially optimal read reference voltage, $V_{REF}$, is below that threshold. Then, since an LLR is a relative measure of probability, errors that occur in both the CDFs used to estimate the lower page LLR are tolerated.

Figure 12:
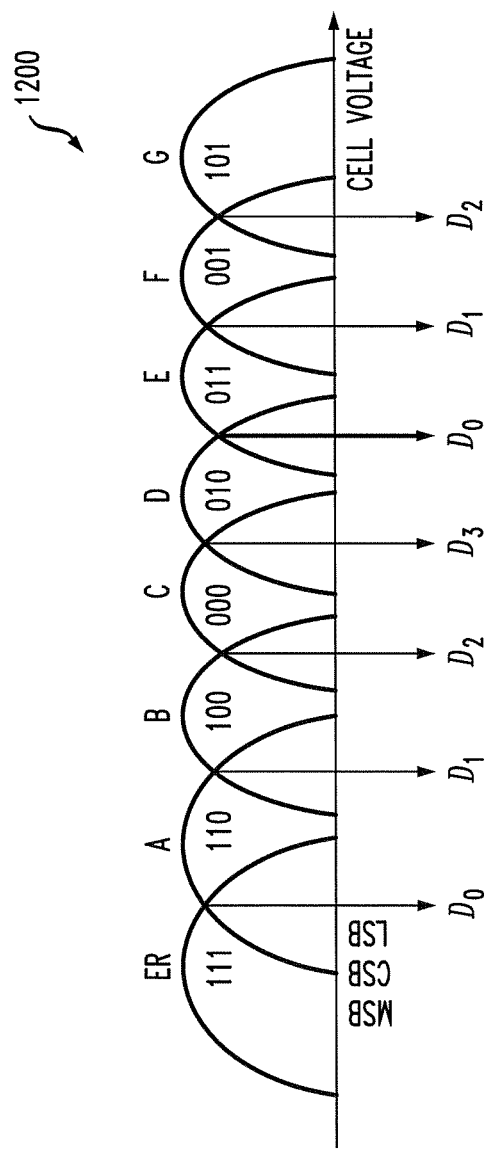
FIG. 12 is a graph of cell voltage distributions for an example tri-level cell (TLC) flash memory, in accordance with some embodiments of the present invention.

FIG. 12 is a graph 1200 of cell voltage distributions ER, A, B, C, D, E, F, G, for an example TLC flash, in accordance with some embodiments of the present invention. Generally, TLC flash is a type of solid-state NAND flash memory that stores three bits of data per cell of flash media. Each distribution ER, A, B, C, D, E, F, G, will have a mean roughly equal to the target voltage for the state, and the variance will depend upon the noise, in a similar manner as FIG. 2. While each cell stores 2 bits (MSB and LSB) in the MLC embodiment of FIG. 2, each cell stores an additional center bit (CSB) in the TLC embodiment of FIG. 12. Because the voltages on the memory cell are not accurate, the voltages read back can vary according to the distributions ER, A, B, C, D, E, F, G. In some embodiments, during a read of the memory cell, reference voltages $D_0$, $D_1$, $D_2$, $D_3$, $D_0$, $D_1$, $D_2$ are used during a read to determine the state of the memory cell, returning hard decisions about the state of the memory cell. Reference voltages $D_1$ between states A and B, $D_3$ between states C and D, and $D_1$ between states E and F are added, relative to the embodiment of FIG. 2, to read the center bit, in a known manner.

The disclosed techniques for estimating written data using the minimum syndrome weight read can be extended to the case of TLC flash. Since there are only two possible polarities in a binary hard decision read, the three decision regions corresponding to the valleys between the state-pairs A/B. C/D, and E/F cannot be distinguished based on the read of CSB page alone. Reading the LSB and MSB pages will enable full decoupling of these three voltage regions to be mapped by asymmetric LLR values. If the LDPC decoder cannot decode any of these pages, the read with minimum syndrome weight can be used as an estimate for the genie data. If only MSB or LSB reads or the corresponding write data is used to find CDF of CSB page, then D1, D3, D2 shift directions are constrained such that shift direction result in unique bit flip polarity.

Figure 13:
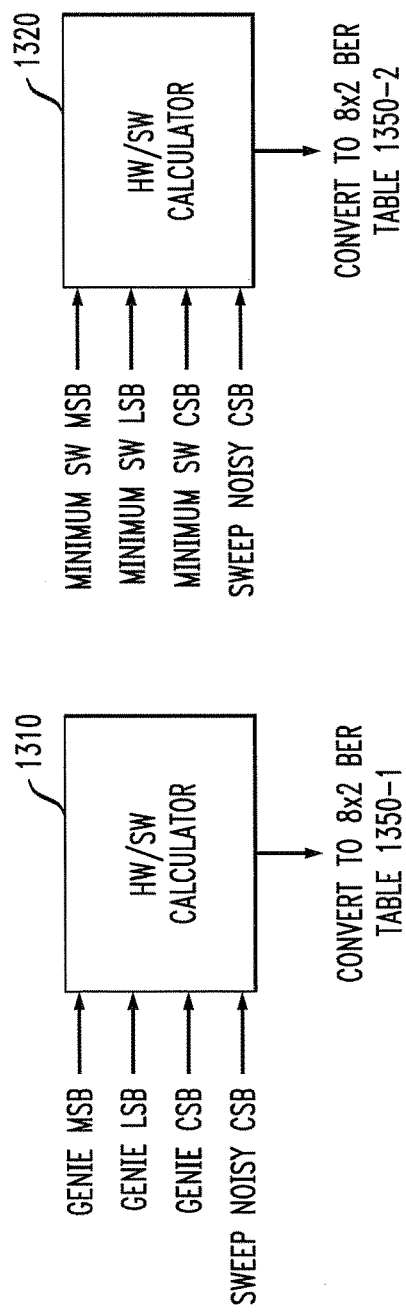
FIG. 13 illustrates a pair of calculators that calculate bit error rates used to derive the cumulative distribution functions of FIGS. 9 and 10A.

FIG. 13 illustrates a pair of calculators 1310, 1320 that calculate bit error rates in a similar manner as FIG. 11, that are used to derive the cumulative distribution functions. The calculators 1310, 1320 can be implemented in hardware (HW) or software (SW). The calculator 1310 determines the bit error rates (e.g., $E_{001}^{111}$) by comparing genie data (i.e., the data that was written) to the noisy read data for MSB, LSB and CSB pages, for example, using an XOR function, in a known manner. If the LDPC decoder can find the genie/written data, a true profile of the directed BER can be found by the calculator 1310 to compute the LLRR of decision regions. For each read at a different read reference voltage, $V_{REF}$, the written MSB/LSB/CSB data is compared by the calculator 1310 to the read MSB/LSB/CSB data and the observed states can be binned to obtain the probability transition table, where $E_{001}^{111}$, for example, indicates the probability of writing "111" to MSB/LSB bits of the cell while reading "001". The calculator 1310 can calculate the transition probabilities.

If the decoder cannot decode the true data, then the codeword with minimum syndrome weight can be used as an estimate of the written data, to compute an approximate directed BER profile in order to substitute for the true BER curves. The calculator 1320 determines the bit error rates by estimating the data that was written (using a minimum syndrome weight (SW) among a plurality of read operations using different read reference voltages, $V_{REF}$) and comparing the estimated written data (referred to as minimum SW MSB/LSB/CSB) to the noisy read data, according to one embodiment of the invention. A given bit error rate, such as $E_{001}^{111}$ indicates the probability that a particular value was written (such as '111') given that a particular value was read (such as '001'). In the case of calculator 1320, the written data is an estimate obtained using the minimum syndrome weight.

The bit error rates generated by the calculators 1310 and 1320 are stored in corresponding bit error rate tables 1350-1, 1350-2, in a similar manner as the table 1150 of FIG. 1.

A channel estimation algorithm based on sampling the BER CDF can provide such additional side information in addition to the ranked list of optimal read reference voltages, $V_{REF}$. This additional side information is the BER CDF that is calculated based on the same page population that is sampled to calculate an optimal $V_{REF}$ in the list.

For a population X having a substantially optimal Vx, $CDF_{1\to 0, x}$ and $CDF_{0\to 1, x}$ are measured, and for population Y having a substantially optimal Vy, $CDF_{1\to 0, y}$ and $CDF_{0\to 1, y}$ are measured. Since channel estimation based on population statistics is done offline based on known written data or genie data recovered by the decoder, then the BER can be based on direct measurement of BER and not necessarily based on a minimum syndrome weight read.

Once a list of substantially optimal read reference voltages, $V_{REF}$, and runner up read reference voltages, $V_{REF}$, is generated, with accompanying BER CDF, then retry optimization is implemented via the same guiding principles explained above, where LLRs are now computed based on the population statistics instead of being computed based on the failing page statistics.

Referring to FIG. 7, in a combined example, for the three example populations A, B and C, ranked based on a size of each population, BER CDFs are calculated based on read statistics from populations A, B and C to be used to calculate the LLRs of decision regions arising from read retry operations 730-1 through 730-7. In each of these retry steps 730-i, though the current failing page being read arises from a voltage distribution that may follow only one of the populations, each LLR assignment at those reads would be chosen to be substantially optimal for at least one of the populations. Once the right population statistics that best fits the failing pages are obtained, then the page will have the best chance for successful recovery. This is true at the beginning of retry with few reads, but correct LLR sign page of the page and recovery, and is also true later in retry, with again suitable LLR assignment but also with more reads that provide finer decision region granularity and higher accuracy soft information.

Figure 14:
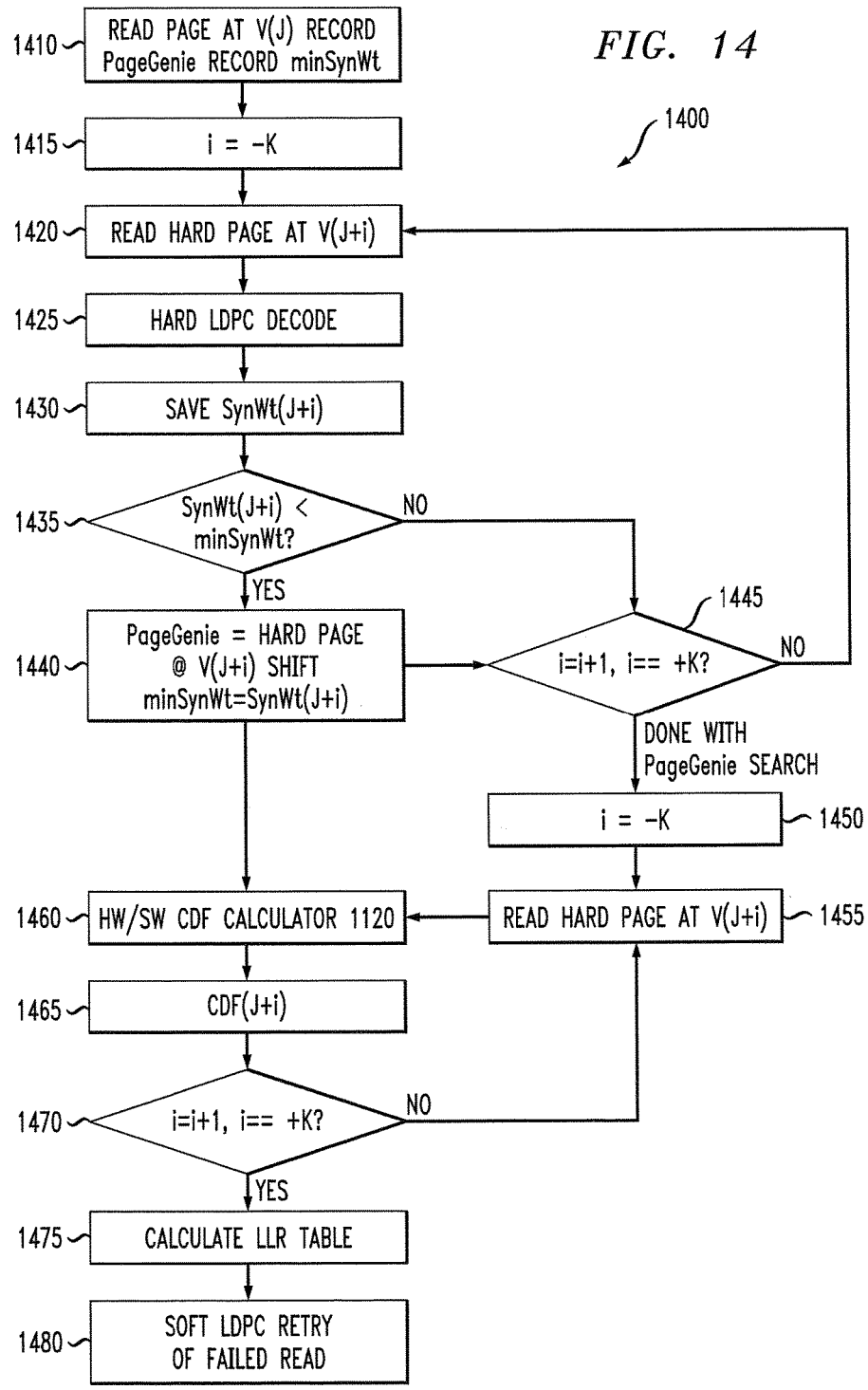
FIG. 14 is a flow chart illustrating one implementation of a cumulative distribution function and log likelihood ratio generation process, according to one embodiment of the invention.

FIG. 14 is a flow chart illustrating an implementation of a cumulative distribution function and log likelihood ratio generation process 1400 according to one embodiment of the invention. As shown in FIG. 14, the example cumulative distribution function and log likelihood ratio generation process 1400 initially reads a page at a particular voltage shift V(J), during step 1410, and the current page genie data (PageGenie) and minimum syndrome weight (minSynWt) are recorded for the page.

A counter, i, is initialized to −K during step 1415, and a loop is entered and during step 1420, a hard page read is performed at a particular voltage shift V(J+i). Hard LDPC decoding is performed during step 1425 and the syndrome weight of the page for the current voltage shift is saved during step 1430.

A test is performed during step 1435 to determine if the syndrome weight of the current voltage shift is less than the recorded minimum syndrome weight. If it is determined during step 1435 that the syndrome weight of the current voltage shift is less than the recorded minimum syndrome weight, then the page genie is set to the hard page at the current voltage shift and the minimum syndrome weight is set to the current syndrome weight during step 1440. During step 1445, the counter, i, is incremented until it reaches +K.

Once the counter reaches +K, the first loop and the page genie search is complete. During step 1450, the counter, i, is reset to −K. During step 1455, a hard page read is performed again at a particular voltage shift V(J+i). The CDF calculator 1120 is activated during step 1460 to process the saved page genie data and generate the cumulative distribution functions for the current read reference voltage, $V_{REF}$, during step 1465. The counter is incremented during step 1470 until it reaches +K.

Once the counter reaches +K, the cumulative distribution function has been computed for each read reference voltage, $V_{REF}$, and the LLR table is calculated during step 1475. A soft LDPC read retry operation of a failed read can be performed during step 1480.

It is noted that the cumulative distribution function and log likelihood ratio generation process 1400 can be triggered by a failing page and/or for each population in the combined example.

Conventional channel estimation techniques (also known as read reference voltage, $V_{REF}$, tracking) usually find a substantially optimal $V_{REF}$ based on some metric (e.g., bit error rate, syndrome weight and/or disparity). The substantially optimal $V_{REF}$ is for a collection of blocks that are garbage collected and erased together which is usually one or more blocks, those blocks would collect with the same program/erase count (PEC). When a read comes from this block group, the read will use the substantially optimal $V_{REF}$ for that block group.

In one or more embodiments, the present invention provides a channel estimation algorithm that calculates read reference voltages, $V_{REF}$, on a smaller granularity, such as page populations derived from each block among a group of blocks with the same PEC, or populations of pages from each block. Channel estimation is performed on each population, in a similar manner as conventional techniques are performed for each block (e.g., averaging the read statistics of the smallest granularity and calculating the BER profile versus shifts in $V_{REF}$ and then finding the $V_{REF}$ shift that minimizes the BER for that population). In further variations, the metric can be disparity or syndrome weight or another media quality metric, rather than bit error rate.

In at least one embodiment, a BER profile is obtained at multiple $V_{REF}$ shifts at a small granularity, such as each page in a block, and then a substantially optimal $V_{REF}$ of that page is found, for every page in the block. The number of pages that share the substantially optimal $V_{REF}$ are counted, and the $V_{REF}$ that is most prevalent will be ranked at the top of the list and the second most prevalent will be the runner up and so on.

CONCLUSION

The foregoing applications and associated embodiments should be considered as illustrative only, and numerous other embodiments can be configured using the read threshold voltage adjustment techniques and LLR constellation assignment techniques disclosed herein. According to one or more embodiments, the methods and processes described herein may be implemented in a controller as software, hardware, or any combination of the two.

For example, the methods and processes described herein may be stored in a memory as part of the firmware of a solid state storage device and may be executed by a processor for performing the methods and processes described herein. The methods and processes described herein may alternatively or additionally be stored in other computer readable media accessible by the controller. In further embodiments, the methods and processes described herein may be implemented in a computing system external to and operably connected to the storage device, such as in a driver module of a host device connected to storage device through an interface, for example. The methods and processes described herein may further be stored in a memory or other computer-readable media accessible by the computing system and be executed by a processor of the computing system.

It should also be understood that the read threshold voltage adjustment techniques and LLR constellation assignment techniques, as described herein, can be implemented at least in part in the form of one or more software programs stored in memory and executed by a processor of a processing device such as a computer. As mentioned previously, as memory or other storage device having such program code embodied therein is an example of what is more generally referred to herein as a "computer program product."

The disclosed read threshold voltage adjustment techniques and LLR constellation assignment techniques may be implemented using one or more processing platforms. One or more of the processing modules or other components may therefore each run on a computer, storage device or other processing platform element. A given such element may be viewed as an example of what is more generally referred to herein as a "processing device."

Figure 15:
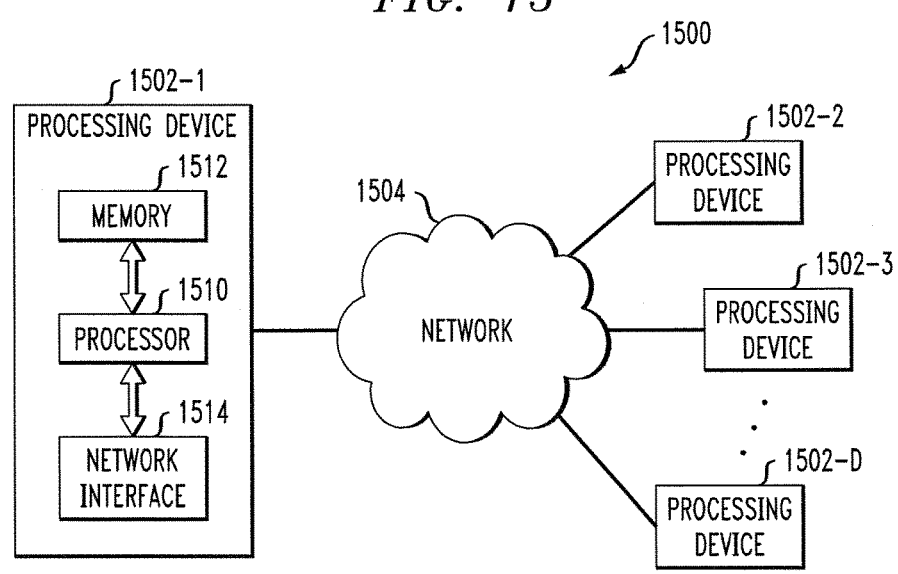
FIG. 15 illustrates a processing platform that may be used to implement at least a portion of one or more embodiments of the invention.

Referring now to FIG. 15, one possible processing platform that may be used to implement at least a portion of one or more embodiments of the invention is shown. The processing platform 1500 in this embodiment comprises at least a portion of the given system and includes at least one processing device(s), denoted 1502-1, 1502-2, 1502-3, . . . 1502-D, which communicate with one another over a network 1504. The network 1504 may comprise any type of network, such as a wireless area network (WAN), a local area network (LAN), a satellite network, a telephone or cable network, a cellular network, a wireless network such as WiFi or WiMAX, or various portions or combinations of these and other types of networks.

The processing device 1502-1 in the processing platform 1500 comprises a processor 1510 coupled to a memory 1512. The processor 1510 may comprise a microprocessor, a microcontroller, an application specific integrated circuit (ASIC), a field programmable gate array (FPGA) or other type of processing circuitry, as well as portions or combinations of such circuitry elements, and the memory 1512, which may be viewed as an example of a "computer program product" having executable computer program code embodied therein, may comprise random access memory (RAM), read only memory (ROM) or other types of memory, in any combination.

Also included in the processing device 1502-1 is network interface circuitry 1514, which is used to interface the processing device with the network 1504 and other system components, and may comprise conventional transceivers.

The other processing devices 1502, if any, of the processing platform 1500 are assumed to be configured in a manner similar to that shown for processing device 1502-1 in the figure.

Again, the particular processing platform 1500 shown in the figure is presented by way of example only, and the given system may include additional or alternative processing platforms, as well as numerous distinct processing platforms in any combination, with each such platform comprising one or more computers, storage devices or other processing devices.

Multiple elements of the system may be collectively implemented on a common processing platform of the type shown in FIG. 15, or each such element may be implemented on a separate processing platform.

As is known in the art, the methods and apparatus discussed herein may be distributed as an article of manufacture that itself comprises a computer readable medium having computer readable code means embodied thereon. The computer readable program code means is operable, in conjunction with a computer system, to carry out all or some of the steps to perform the methods or create the apparatuses discussed herein. The computer readable medium may be a tangible recordable medium (e.g., floppy disks, hard drives, compact disks, memory cards, semiconductor devices, chips, application specific integrated circuits (ASICs)) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic media or height variations on the surface of a compact disk.

It should again be emphasized that the above-described embodiments of the invention are presented for purposes of illustration only. Many variations and other alternative embodiments may be used. For example, the techniques are applicable to a variety of other types of solid state storage device that can benefit from the read threshold voltage adjustment processes disclosed herein. Also, the particular configuration of processing device elements shown herein, and the associated read threshold voltage adjustment techniques, can be varied in other embodiments. Moreover, the various simplifying assumptions made above in the course of describing the illustrative embodiments should also be viewed as exemplary rather than as requirements or limitations of the invention. Numerous other alternative embodiments within the scope of the appended claims will be readily apparent to those skilled in the art.

What is claimed is:

1. A method, comprising:

reading at least one codeword from a memory a plurality of times using a plurality of read reference voltages;

obtaining a syndrome weight for each of the readings of the at least one codeword;

identifying a given one of the readings of the at least one codeword having a substantially minimum syndrome weight;

estimating, using at least one processing device, a written value of the at least one codeword by setting the estimated written value to the given one of the readings when the value of the at least one codeword that was written is not known at a time before the given one of the readings; and calculating at least one cell voltage probability distribution of cell voltages for a corresponding cell state of the memory by calculating a bit error between the estimated written value and the plurality of reads of the at least one codeword.

2. The method of claim 1, wherein the syndrome weight is obtained from one or more of a decoder and a dedicated hardware circuit.

3. The method of claim 1, wherein the cell voltage probability distributions comprise one or more of cumulative distribution functions and derived probability distributions.

4. The method of claim 1, wherein the given one of the readings is used as the estimate only if the substantially minimum syndrome weight satisfies a predefined threshold.

5. The method of claim 1, wherein the at least one cell voltage probability distribution is used to dynamically select log likelihood ratio values for a failing page.

6. The method of claim 1, wherein the at least one cell voltage probability distribution is used to determine a read reference voltage that gives a desired log likelihood ratio value.

7. The method of claim 1, wherein the at least one cell voltage probability distribution is obtained for a plurality of page populations and are processed to dynamically select log likelihood ratio values for the plurality of page populations.

8. A device comprising:
a controller configured to:
read at least one codeword from a memory a plurality of times using a plurality of read reference voltages;
obtain a syndrome weight for each of the readings of the at least one codeword;
identify a given one of the readings of the at least one codeword having a substantially minimum syndrome weight;
estimate, using at least one processing device, a written value of the at least one codeword by setting the estimated written value to the given one of the readings when the value of the at least one codeword that was written is not known at a time before the given one of the readings; and
calculate at least one cell voltage probability distribution of cell voltages for a corresponding cell state of the memory by calculating a bit error between the estimated written value and the plurality of reads of the at least one codeword.

9. The device of claim 8, wherein the given one of the readings is used as the estimate only if the substantially minimum syndrome weight satisfies a predefined threshold.

10. The device of claim 8, wherein the at least one cell voltage probability distribution is used to dynamically select log likelihood ratio values for a failing page.

11. The device of claim 8, wherein the at least one cell voltage probability distribution is used to determine a read reference voltage that gives a desired log likelihood ratio value.

12. The device of claim 8, wherein the at least one cell voltage probability distribution is obtained for a plurality of page populations and are processed to dynamically select log likelihood ratio values for the plurality of page populations.

13. A computer program product, comprising a non-transitory machine-readable storage medium having encoded therein executable code of one or more software programs, wherein the one or more software programs when executed by at least one processing device perform the following steps:
reading at least one codeword from a memory a plurality of times using a plurality of read reference voltages;
obtaining a syndrome weight for each of the readings of the at least one codeword;
identifying a given one of the readings of the at least one codeword having a substantially minimum syndrome weight;
estimating, using at least one processing device, a written value of the at least one codeword by setting the estimated written value to the given one of the readings when the value of the at least one codeword that was written is not known at a time before the given one of the readings; and
calculating at least one cell voltage probability distribution of cell voltages for a corresponding cell state of the memory by calculating a bit error between the estimated written value and the plurality of reads of the at least one codeword.

14. The computer program product of claim 13, wherein the given one of the readings is used as the estimate only if the substantially minimum syndrome weight satisfies a predefined threshold.

15. The computer program product of claim 13, wherein the at least one cell voltage probability distribution is used to dynamically select log likelihood ratio values for a failing page.

16. The computer program product of claim 13, wherein the at least one cell voltage probability distribution is used to determine a read reference voltage that gives a desired log likelihood ratio value.

17. The computer program product of claim 13, wherein the at least one cell voltage probability distribution is obtained for a plurality of page populations and are processed to dynamically select log likelihood ratio values for the plurality of page populations.

18. The method of claim 5, wherein the at least one cell voltage probability distribution is obtained for the failing page by comparing one or more of the estimated written data and actual written data for the failing page to data that was read for the failing page, for a plurality of the read reference voltages.

19. The device of claim 10, wherein the at least one cell voltage probability distribution is obtained for the failing page by comparing one or more of the estimated written data and actual written data for the failing page to data that was read for the failing page, for a plurality of the read reference voltages.

20. The computer program product of claim 15, wherein the at least one cell voltage probability distribution is obtained for the failing page by comparing one or more of the estimated written data and actual written data for the failing page to data that was read for the failing page, for a plurality of the read reference voltages.

* * * * *